United States Patent
Ching et al.

(10) Patent No.: US 10,763,255 B2
(45) Date of Patent: Sep. 1, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Shi-Ning Ju, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/103,721

(22) Filed: Aug. 14, 2018

(65) Prior Publication Data

US 2020/0058649 A1    Feb. 20, 2020

(51) Int. Cl.
| | | |
|---|---|---|
| *H01L 27/088* | (2006.01) | |
| *H01L 29/08* | (2006.01) | |
| *H01L 21/8234* | (2006.01) | |
| *H01L 21/762* | (2006.01) | |
| *H01L 21/311* | (2006.01) | |
| *H01L 29/66* | (2006.01) | |
| *H01L 29/78* | (2006.01) | |
| *H01L 27/02* | (2006.01) | |
| *H01L 29/165* | (2006.01) | |
| *H01L 21/033* | (2006.01) | |
| *H01L 21/02* | (2006.01) | |
| *H01L 21/027* | (2006.01) | |
| *H01L 21/3105* | (2006.01) | |

(Continued)

(52) U.S. Cl.
CPC .... *H01L 27/0886* (2013.01); *H01L 21/31111* (2013.01); *H01L 21/31116* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 27/0207* (2013.01); *H01L 29/0847* (2013.01); *H01L 29/66545* (2013.01); *H01L 29/7848* (2013.01); *H01L 21/0217* (2013.01); *H01L 21/0228* (2013.01); *H01L 21/0274* (2013.01); *H01L 21/02271* (2013.01); *H01L 21/0332* (2013.01); *H01L 21/31053* (2013.01); *H01L 21/32139* (2013.01); *H01L 29/165* (2013.01); *H01L 29/205* (2013.01)

(58) Field of Classification Search
None
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |

(Continued)

OTHER PUBLICATIONS

U.S. Appl. No. 15/883,684, filed Jan. 30, 2018.
U.S. Appl. No. 15/864,525, filed Jan. 8, 2018.

*Primary Examiner* — Chandra Chaudhari
(74) *Attorney, Agent, or Firm* — Maschoff Brennan

(57) ABSTRACT

A semiconductor device has a first fin, a second fin, an isolation structure between the first fin and the second fin, a dielectric stage in the isolation structure, and a helmet layer over the dielectric stage. A top surface of the helmet layer is higher than a top surface of the isolation structure.

20 Claims, 31 Drawing Sheets

(51) Int. Cl.
*H01L 21/3213* (2006.01)
*H01L 29/205* (2006.01)

(56) References Cited

U.S. PATENT DOCUMENTS

| | | | |
|---|---|---|---|
| 9,245,805 B2 | | 1/2016 | Yeh et al. |
| 9,281,382 B2 | * | 3/2016 | Liu .................... H01L 29/66795 |
| 9,418,897 B1 | | 8/2016 | Ching et al. |
| 9,425,201 B2 | * | 8/2016 | Liaw .................... H01L 27/1104 |
| 9,520,482 B1 | | 12/2016 | Chang et al. |
| 9,576,814 B2 | | 2/2017 | Wu et al. |
| 9,608,116 B2 | | 3/2017 | Ching et al. |
| 9,812,363 B1 | * | 11/2017 | Liao ................ H01L 21/823418 |
| 9,859,380 B2 | | 1/2018 | Lee et al. |

* cited by examiner

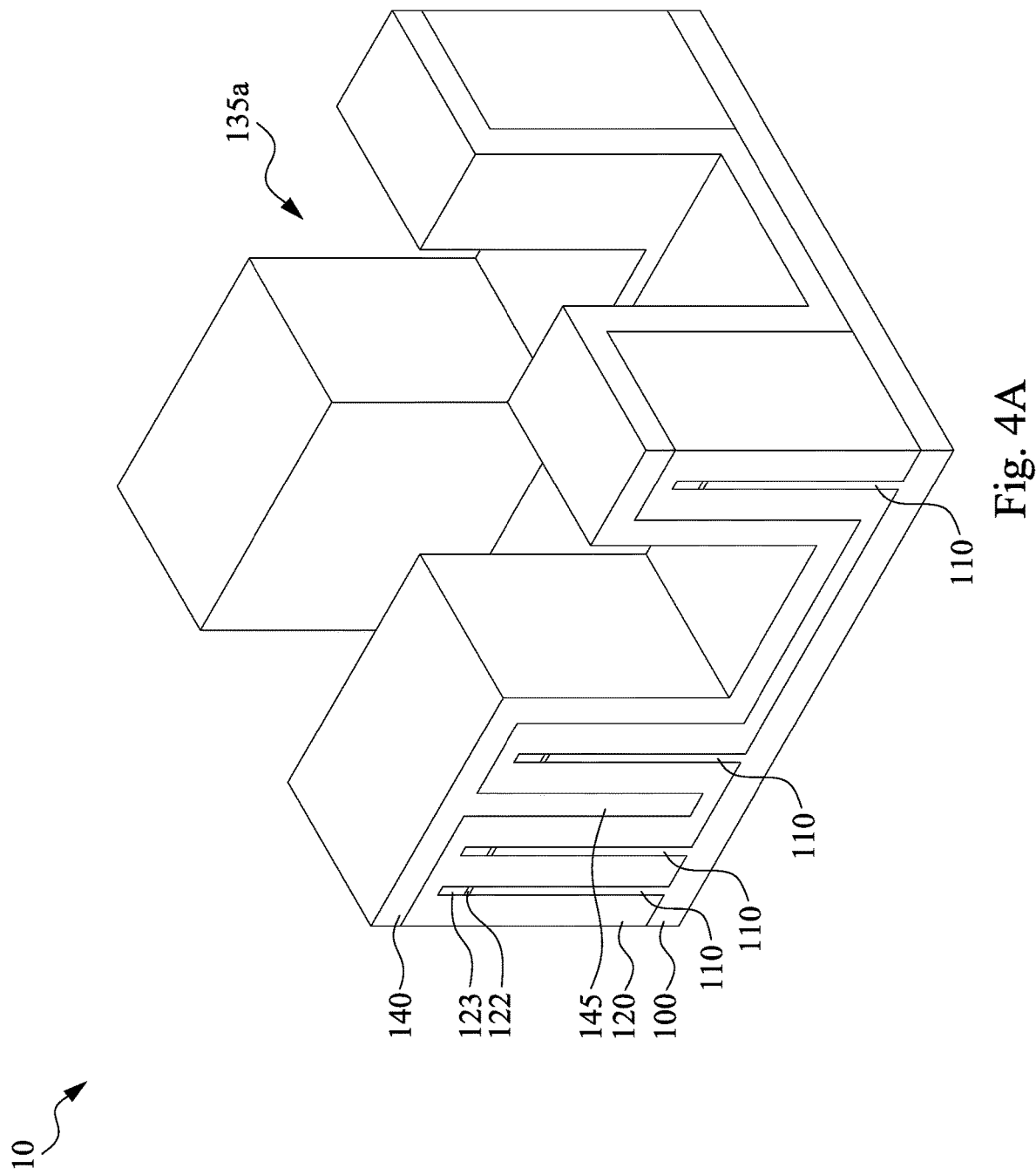

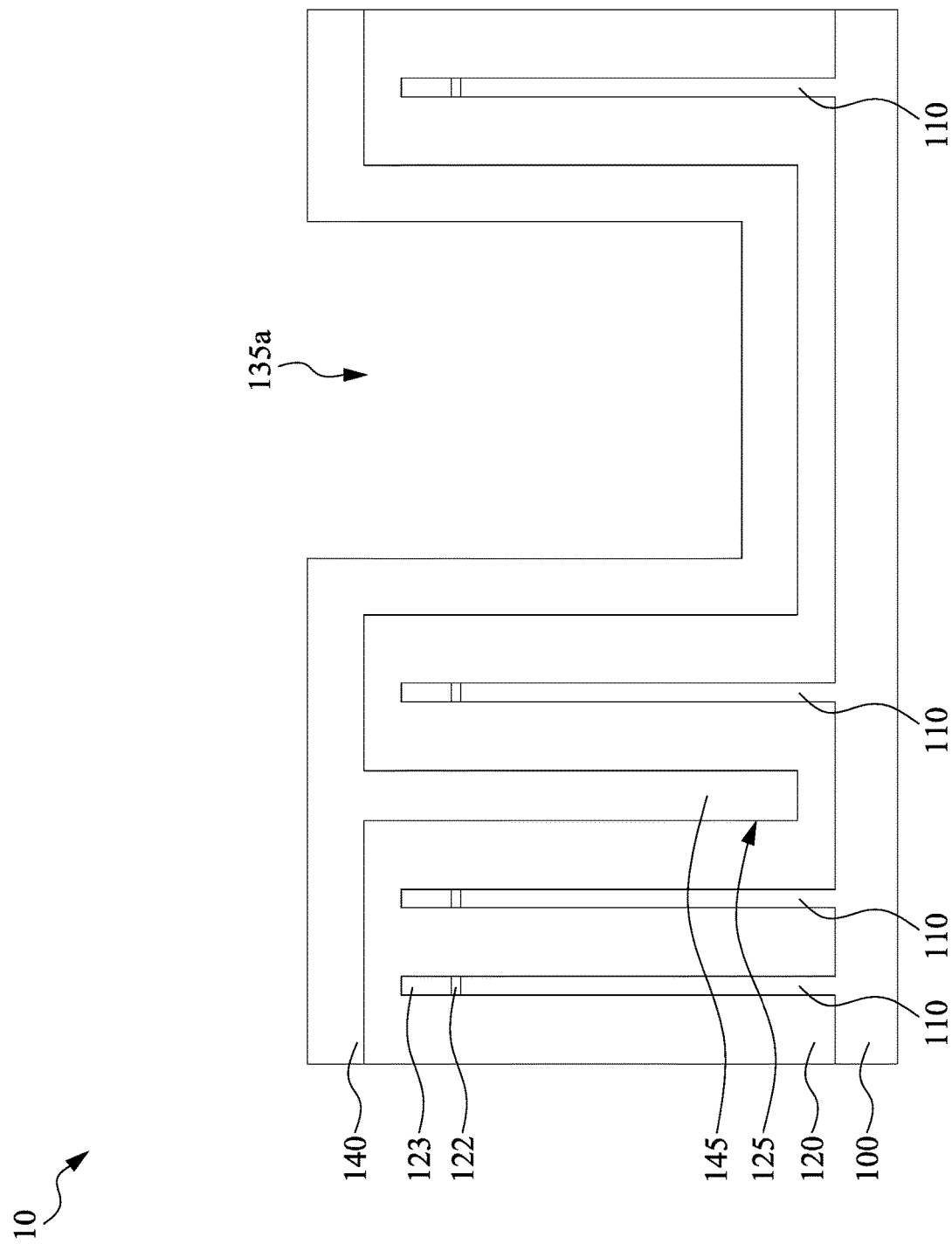

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 15A are perspective views of a method for manufacturing a semiconductor device at various stages in accordance with some embodiments of the present disclosure.

FIGS. 1B to 15B are side views of FIGS. 1A to 15A, respectively.

DETAILED DESCRIPTION

Figure 1A:
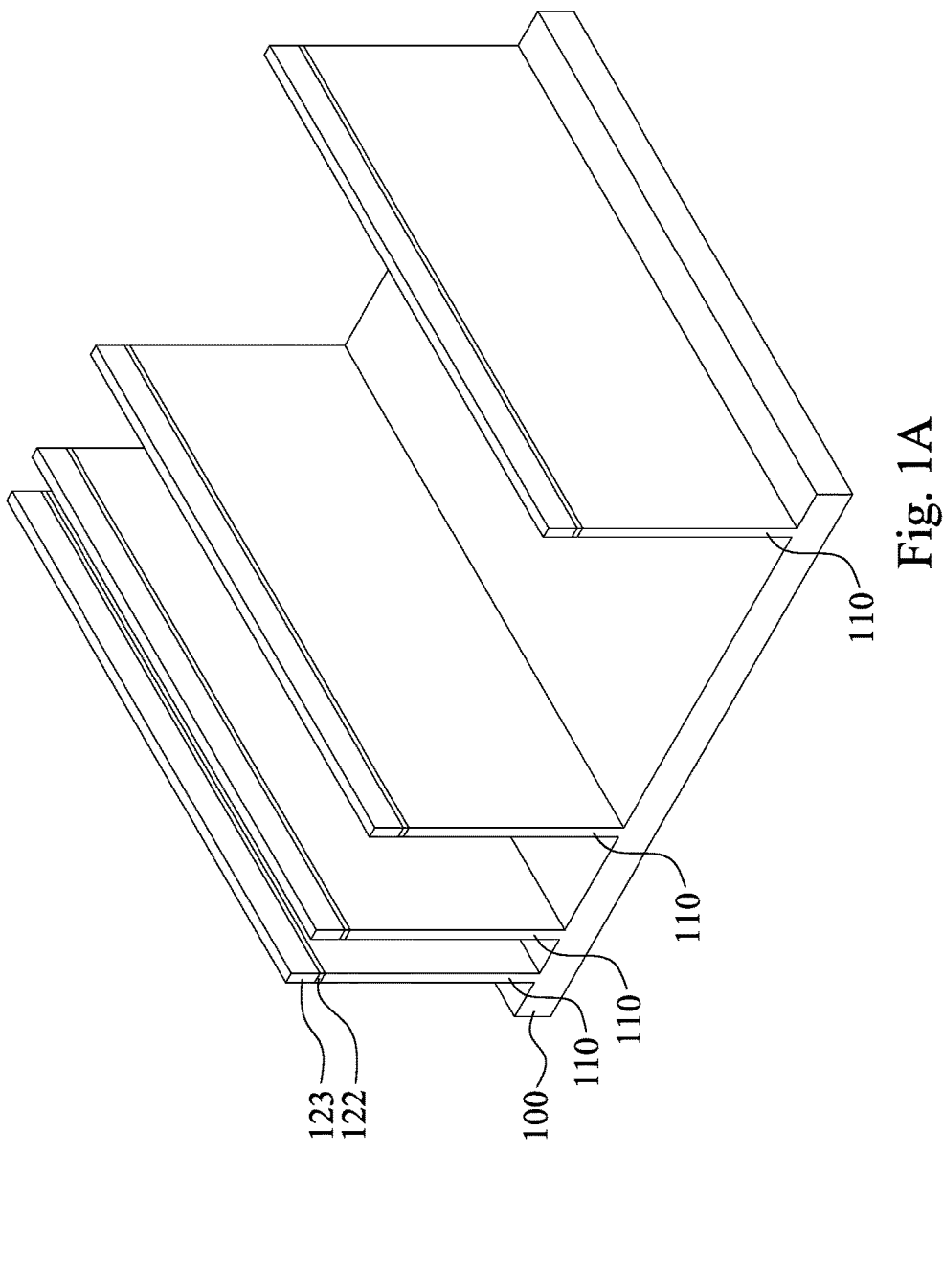

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure will be described with respect to embodiments for semiconductors formed of fin field effect transistors (FinFETs). The embodiments of the disclosure may also be applied, however, to a variety of integrated circuits. Various embodiments will be explained in detail with reference to the accompanying drawings.

FIGS. 1A to 15A are perspective views of a method for manufacturing a semiconductor device at various stages in accordance with some embodiments of the present disclosure. FIGS. 1B to 15B are side views of FIGS. 1A to 15A, respectively. FIG. 15C is a cross-sectional view taken along the metal gate direction MG of FIG. 15A.

Figure 1B:
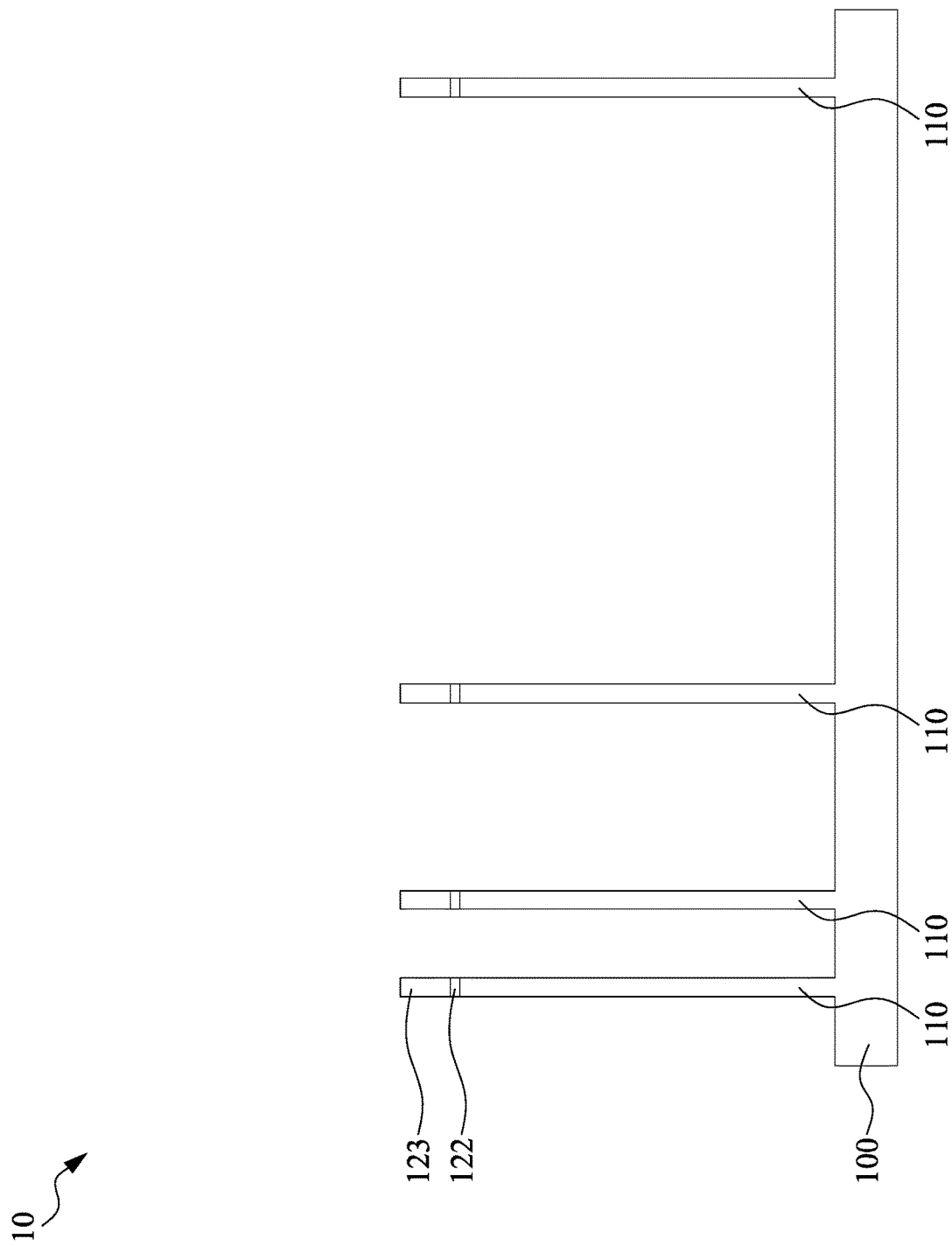

Reference is made to FIGS. 1A and 1B. The semiconductor device 10 includes a substrate with plural patterned fins stood upright and device features can be formed on, above or over the plural patterned fins.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Semiconductor fins 110 are formed over the substrate 100 within different functional regions, e.g., a LOGIC region and/or a memory region. In some embodiments, the semiconductor fins 110 may be of the same type or of different types. For example, some of the fins 110 are n-type semiconductor fins, and the others of the fins 110 are p-type semiconductor fins, and the present disclosure is not limited in this respect.

In some embodiments, a pad layer 122 and a mask layer 123 are disposed on the semiconductor fins 110. In some embodiments, the pad layer 122 may be a thin film comprising silicon oxide formed, for example, using a thermal oxidation process. The pad layer 122 may act as an adhesion layer between the semiconductor fins 110 and the mask layer 123. In some embodiments, the mask layer 123 is formed of silicon nitride, for example, using low-pressure chemical vapor deposition (LPCVD) or plasma enhanced chemical vapor deposition (PECVD). The mask layer 123 is used as a hard mask during following processes, such as photolithography.

The semiconductor fins 110 may be formed by suitable method. For example, a pad layer and a mask layer may be blanketed over the substrate 100. A patterned photo-sensitive layer is formed over the substrate 100. Then, the pad layer, the mask layer, and the substrate 100 may be patterned using one or more photolithography processes with the patterned photo-sensitive layer, including double-patterning or multi-patterning processes, to form the pad layer 122, the mask layer 123, and the semiconductor fins 110.

Figure 2A:
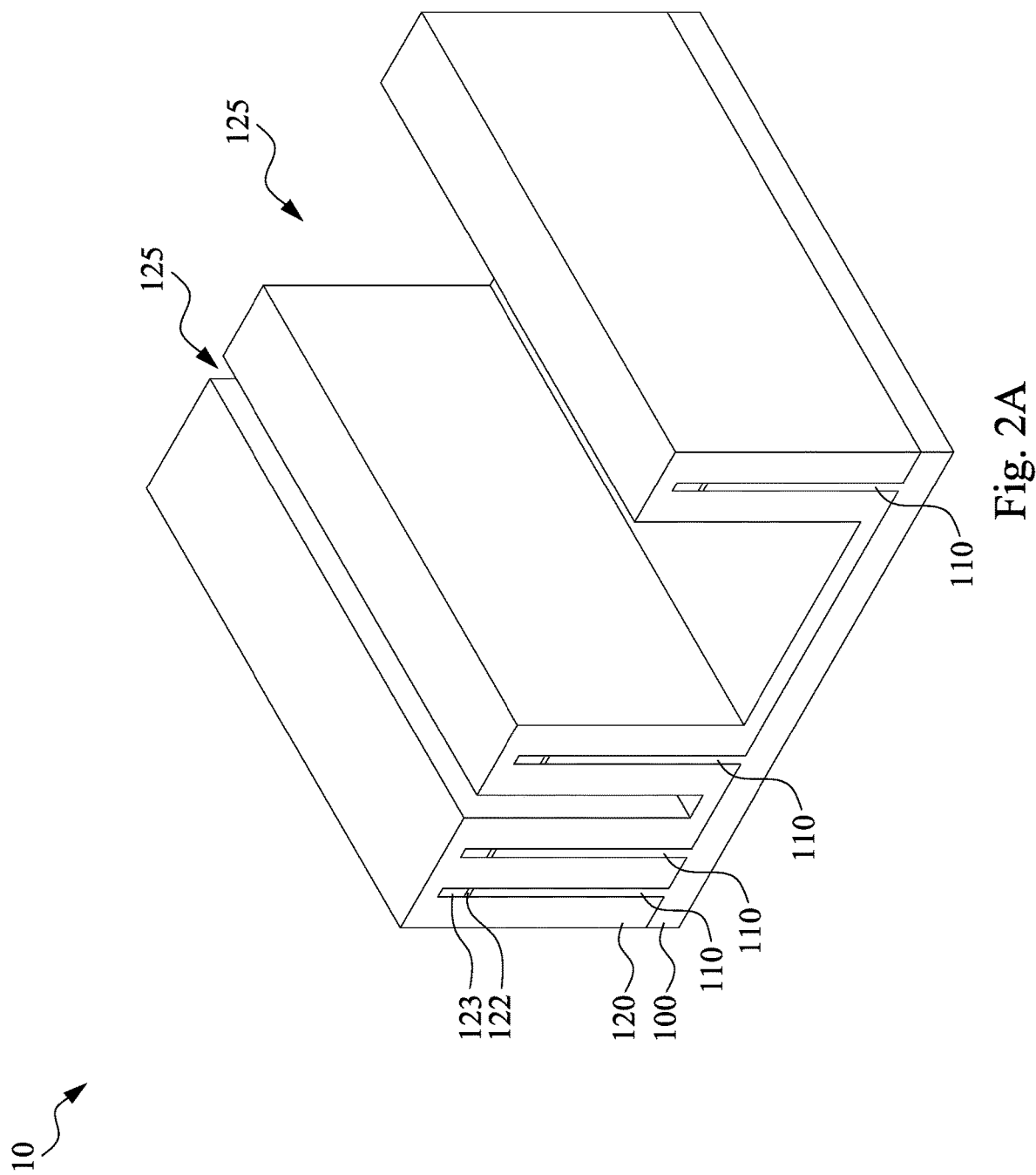
Figure 2B:
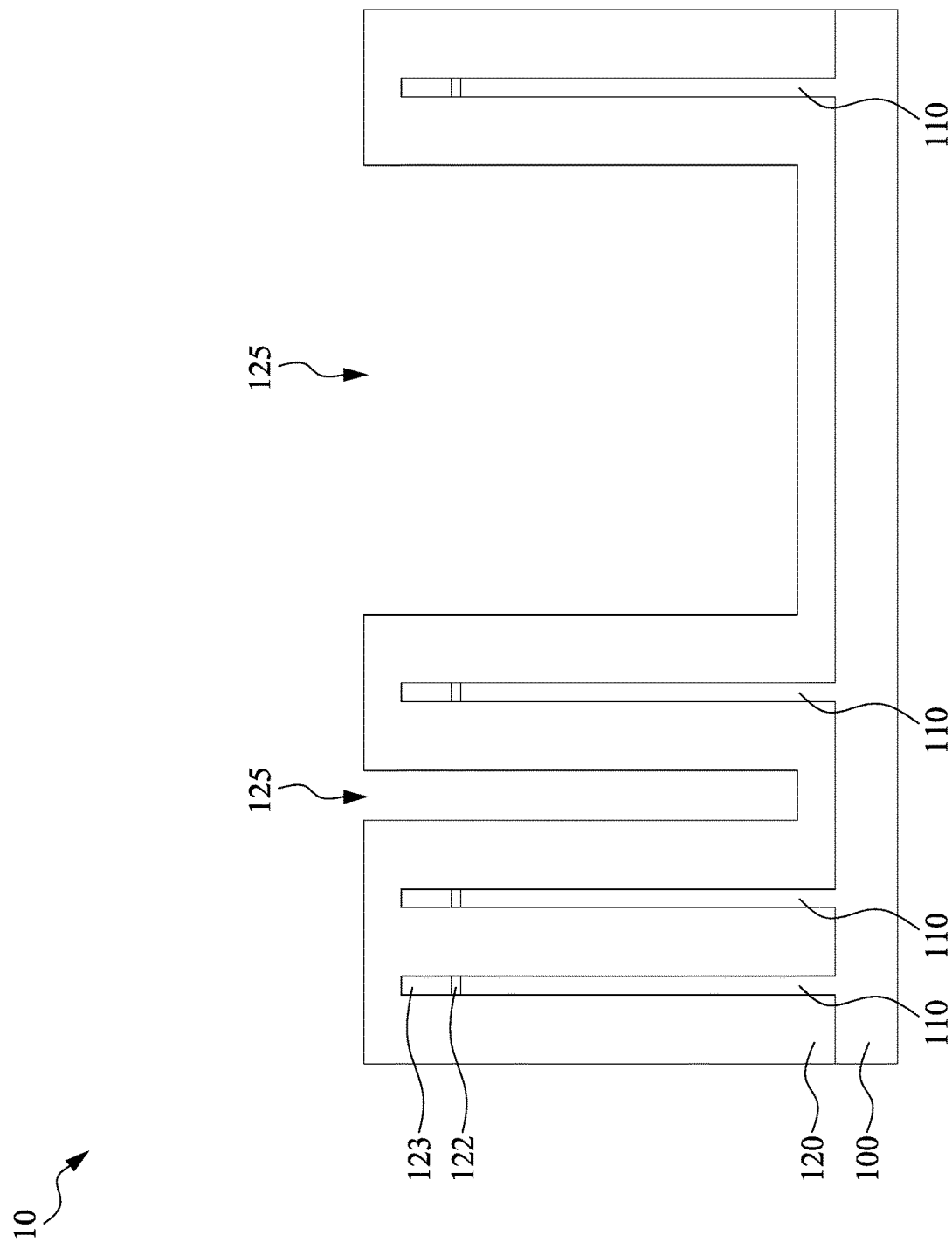

Reference is made to FIGS. 2A and 2B. A liner or spacer layer 120 is formed over the substrate 100. In some embodiments, the liner or spacer layer 120 is formed to conformally cover the semiconductor fins 110 by suitable deposition process, such as atomic layer deposition (ALD). Thus, plural trenches 125 are formed in the liner or spacer layer 120 and between the semiconductor fins 110 and 210. For example, some trenches 125 are formed between relatively close fins 110, and some other trenches 125 are formed between relatively distant fins 110. In some embodiments, a thickness of the liner or spacer layer 120 is about 12 nm to about 19 nm, and the present disclosure is not limited in this respect.

However, in some embodiments, if two adjacent fins are too close, the liner or spacer layer 120 may be filled in the space between the fins. For example, since the semiconductor fins 110 at the left side in FIG. 3B are close enough, the liner or spacer layer 120 is filled in the space between the semiconductor fins 110, and no trench is formed therebetween.

Figure 3A:
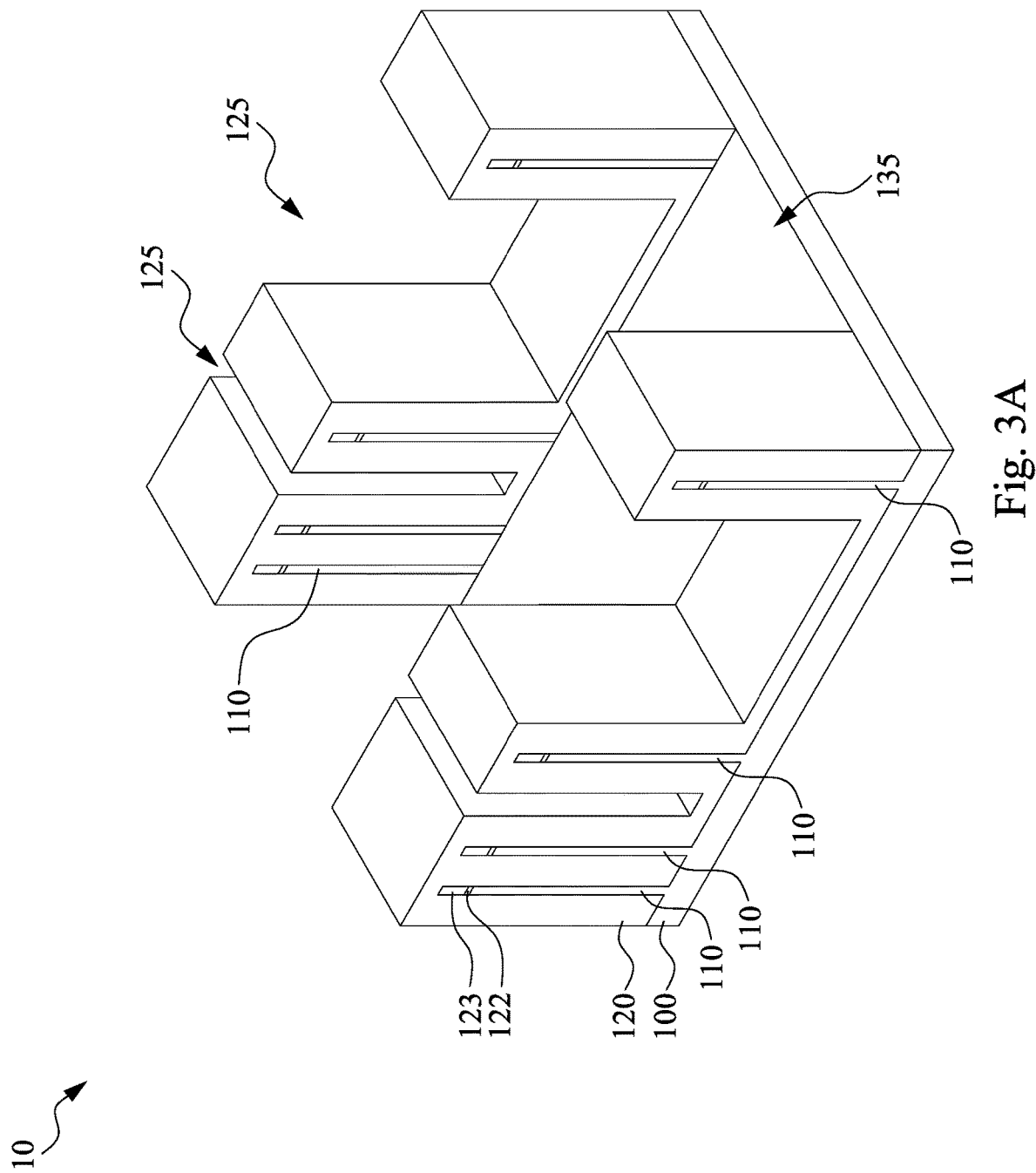
Figure 3B:
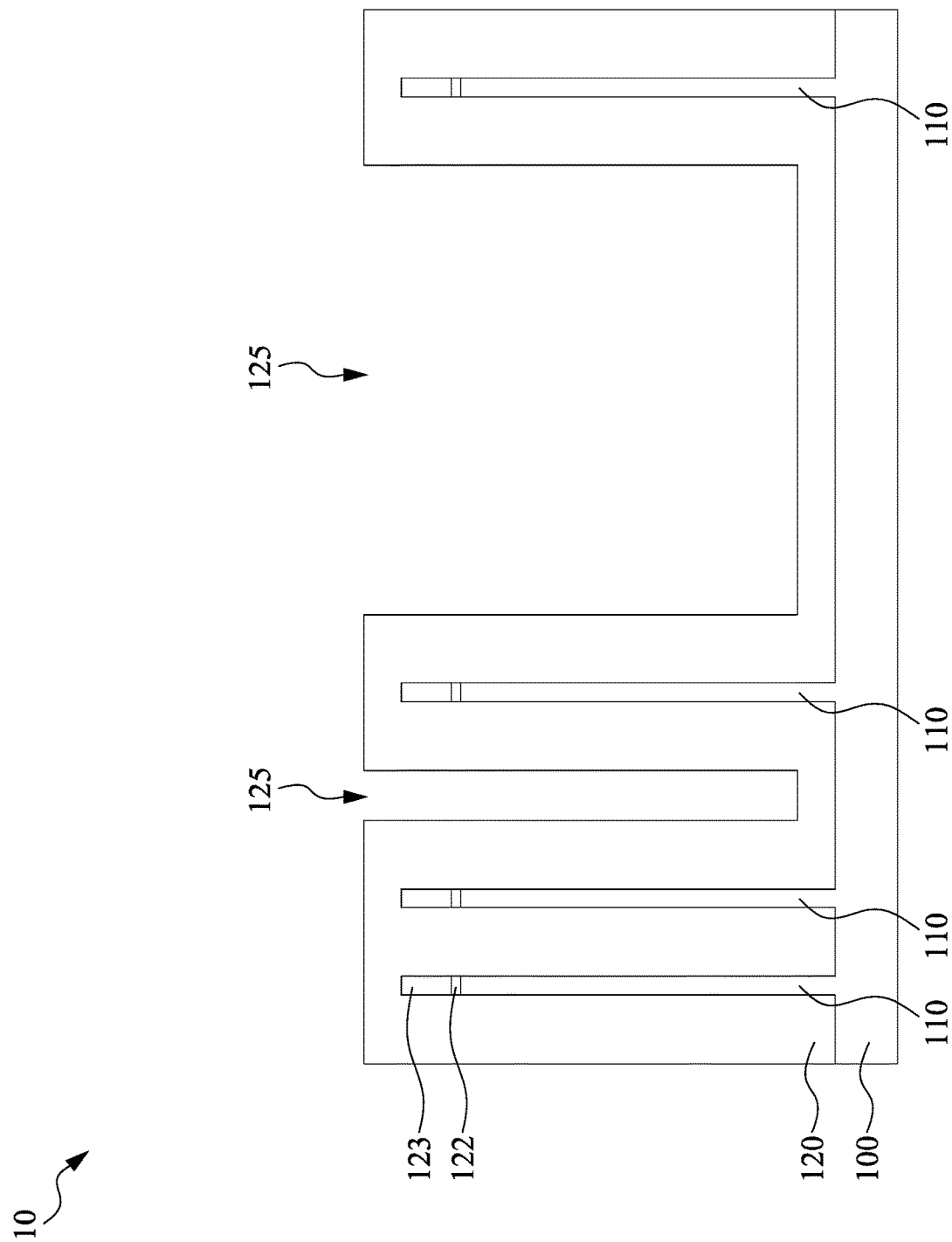

Reference is made to FIGS. 3A and 3B. One or more etching process(es) are performed to remove parts of the semiconductor fins 110 and the liner or spacer layer 120 to form a recess 135 and cut each of the fins 110 into two portions such that end surfaces of two separate portions of each fin 110 are exposed from the recess 135. As a result, the recess 135 and the larger trench 125 between the patterned fins 110 collectively form a cross-shaped concave area (i.e., from a top view) exposing parts of the substrate 100. Some mask layer may be used and patterned to define the cross-shaped area before the etching process(es).

In some embodiments, the etching process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Reference is made to FIGS. 4A and 4B. A dielectric layer 140 is formed over the substrate 100 and filling the trenches 125 and the recess 135. In some embodiments, the portions of the dielectric layer 140 filled in the trenches 125 may be referred to as dielectric fin or dummy fins 145. The dummy fins 145 are formed between some of the semiconductor fins 110. For example, a dummy fin 145 is formed between immediate-adjacent two of the semiconductor fins 110. The dummy fin 145 may be spaced from the adjacent semiconductor fins 110 by the liner or spacer layer 120, and a bottom of the dummy fin 145 may also be spaced from the substrate 100 by the liner or spacer layer 120. The dielectric layers 140 and the dummy fin 145 may also be collectively referred as a dielectric dummy fin layer. In some embodiments, the dielectric layer 140 is in contact with end surfaces of the semiconductor fins 110.

In some embodiments, the relative large trench 125 and the recess 135 covered by the dielectric layer 140 collectively form a cross-shaped concave recess 135a. The dielectric layer 140 surrounding the recess 135a may be spaced from the adjacent semiconductor fins 110 by the liner or spacer layer 120, and a bottom of the dielectric layer 140 may also be spaced from the substrate 100 by the liner or spacer layer 120.

In some embodiments, the dielectric layer 140 may include silicon nitride (SiN), oxynitride, silicion carbon (SiC), silicon oxynitride (SiON), oxide, $SiO_2$, $Si_3N_4$, SiOCN, or metal oxides, such as $HfO_2$, $ZrO_2$, $HfAlO_x$, $HfSiO_x$ and the like and may be formed by methods utilized to form such a layer, such as CVD, plasma enhanced CVD, sputter, and other methods known in the art.

Figure 5A:
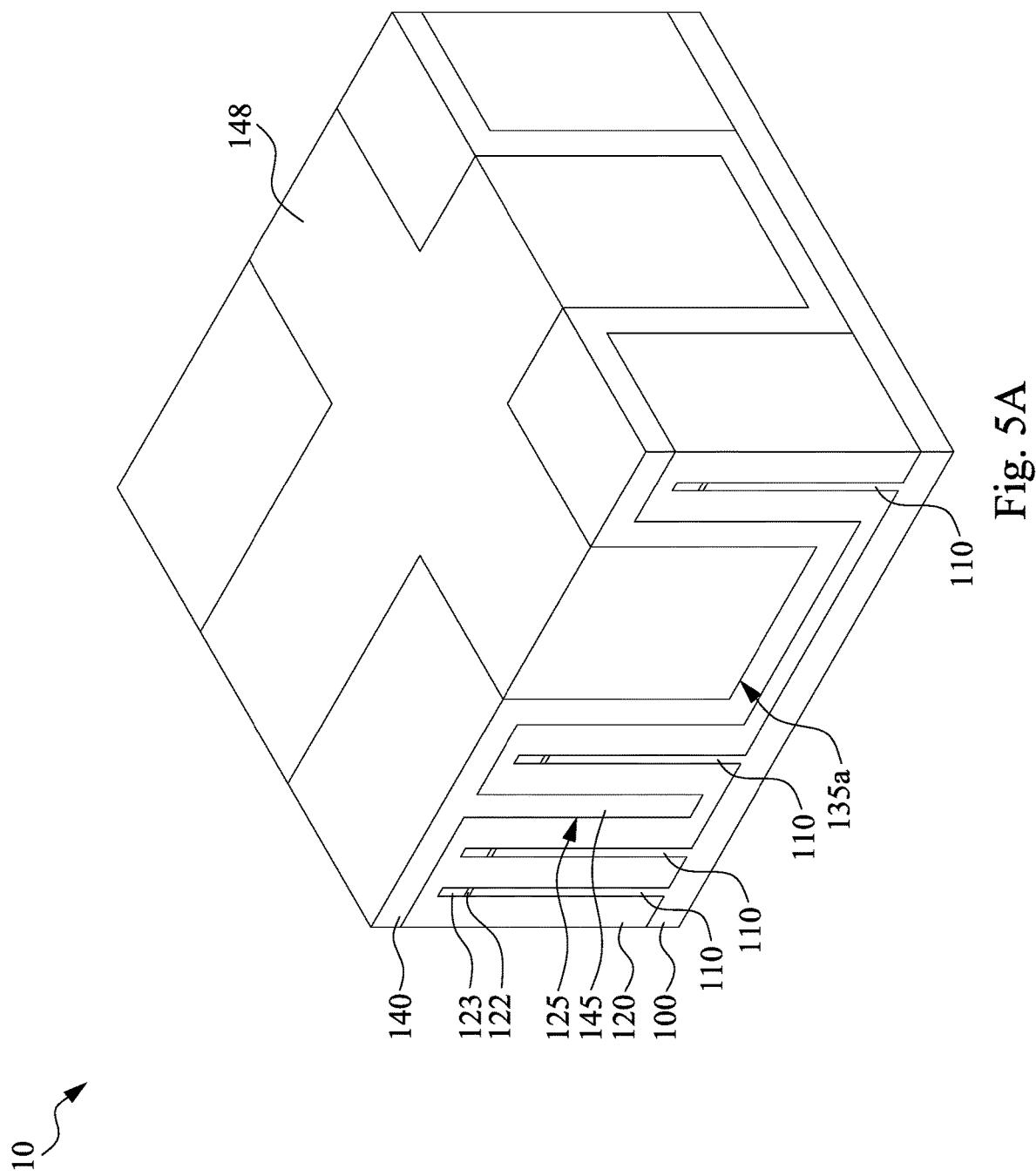
Figure 5B:
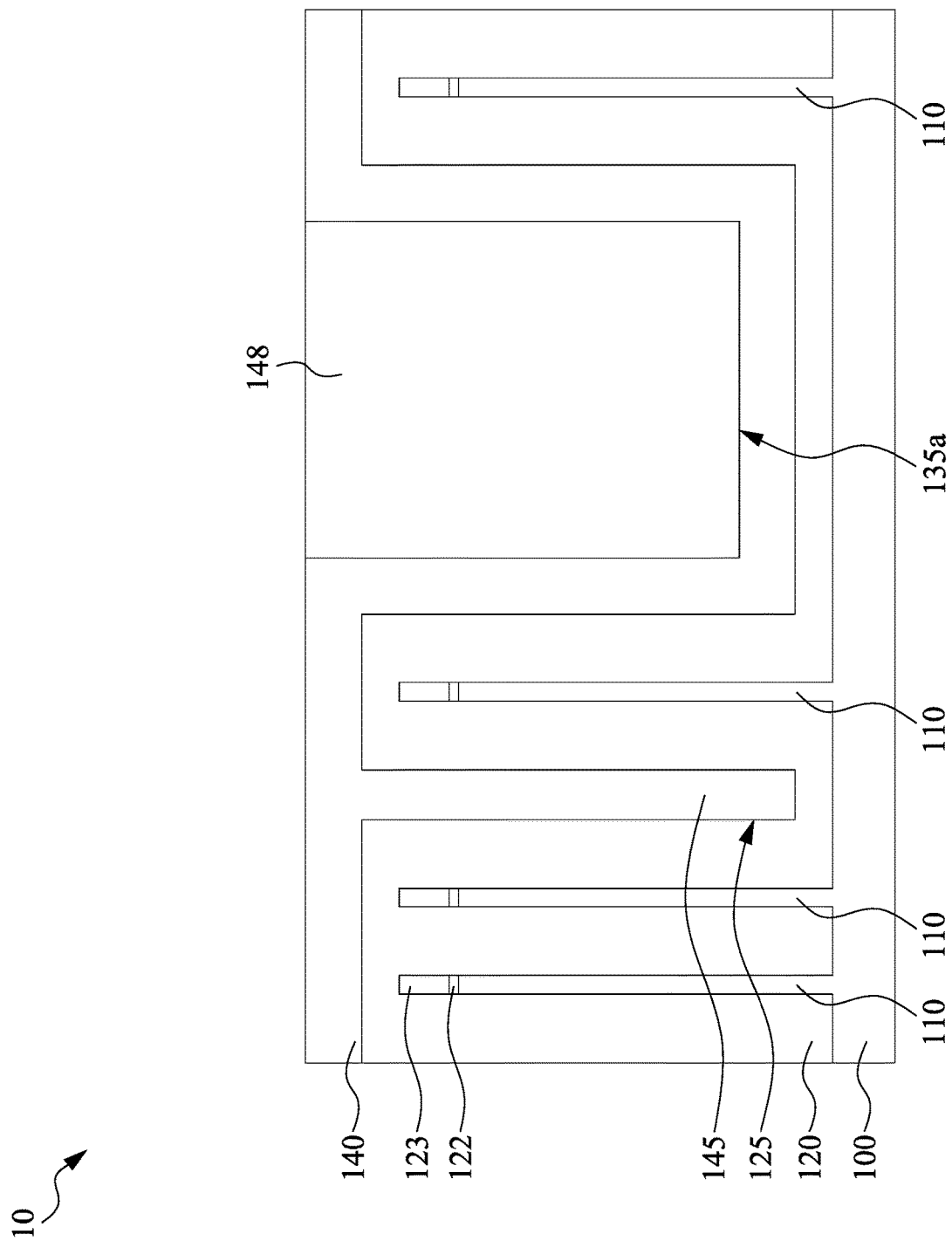

Reference is made to FIGS. 5A and 5B. A silicon oxide 148 is deposited in the cross-shaped concave recess 135a. In some embodiments, the silicon oxide 148 may be deposited by first depositing a flowable oxide and converting the flowable oxide to silicon oxide. The flowable oxide may be deposited using a spin on glass (SOG) or flowable chemical vapor deposition (FCVD) process. Unlike the HDPCVD process, the SOG process and the FCVD process do not damage the semiconductor substrate 100 (the sidewall and bottom of the trench). Thus, the current leakage caused by the HDPCVD process can be avoided. After being deposited in the recess 135a, the flowable oxide may be cured at a temperature ranging from about 600 degrees C. to about 1000 degrees C., to convert the flowable oxide to silicon oxide. From a top view, a cross-shaped area, i.e., the silicon oxide 148, is formed between separate and adjacent dielectric layers 140.

Figure 6A:
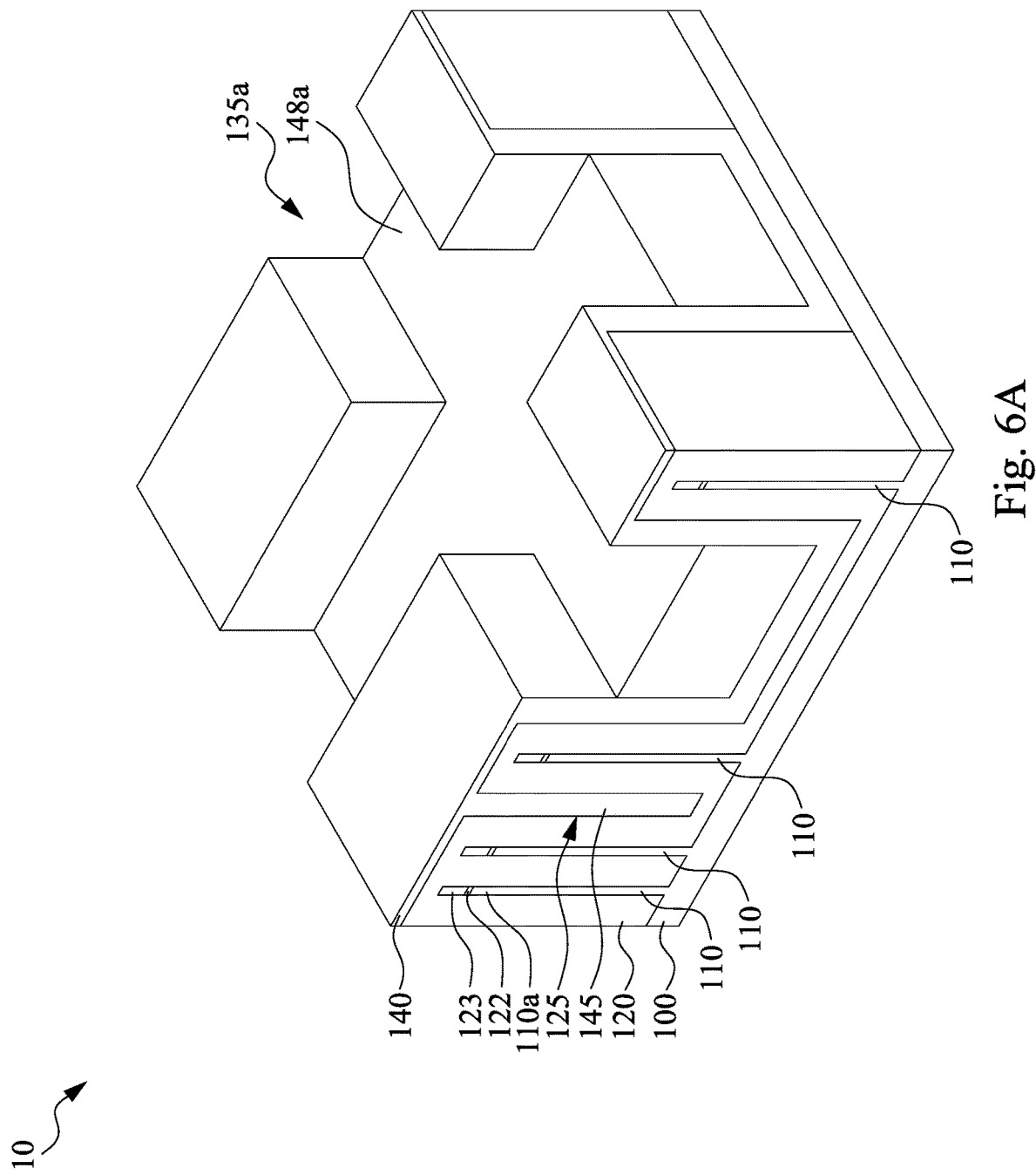
Figure 6B:
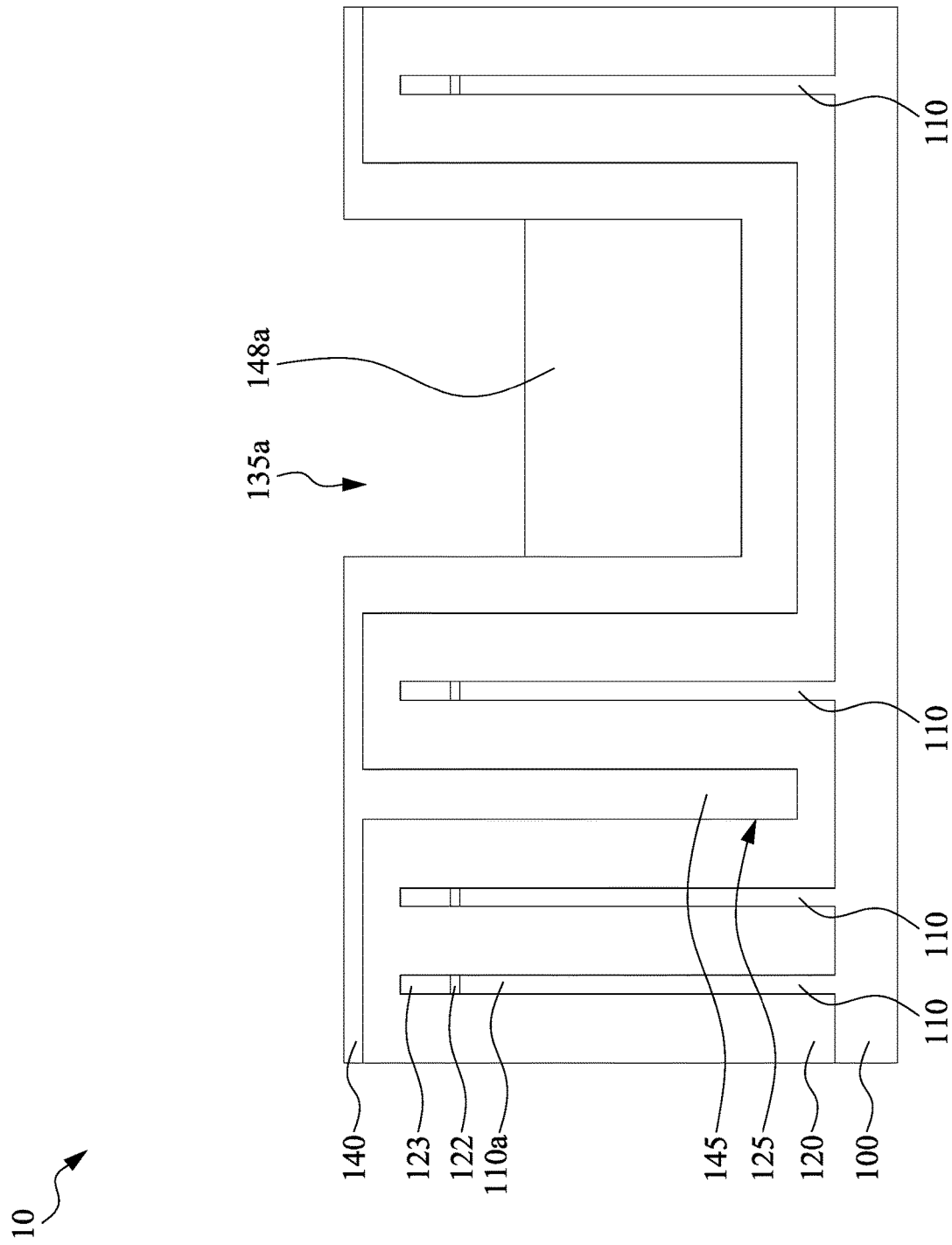

Reference is made to FIGS. 6A and 6B. One or more etching process(es) are performed to remove at least part of the dielectric layer 140 and top portions of the silicon oxide 148 until a top surface of the remaining silicon oxide 148a is below a top portion 110a of the semiconductor fin 110. In some embodiments, the top surface of the remaining silicon oxide 148a may be at least below an interface between the pad layer 122 and the semiconductor fin 110. After etching the silicon oxide 148, the oxide-filled recess 135a is a concave recess with the dielectric layer 140 as surrounding sidewalls and the remaining silicon oxide 148a as a bottom.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 7A:
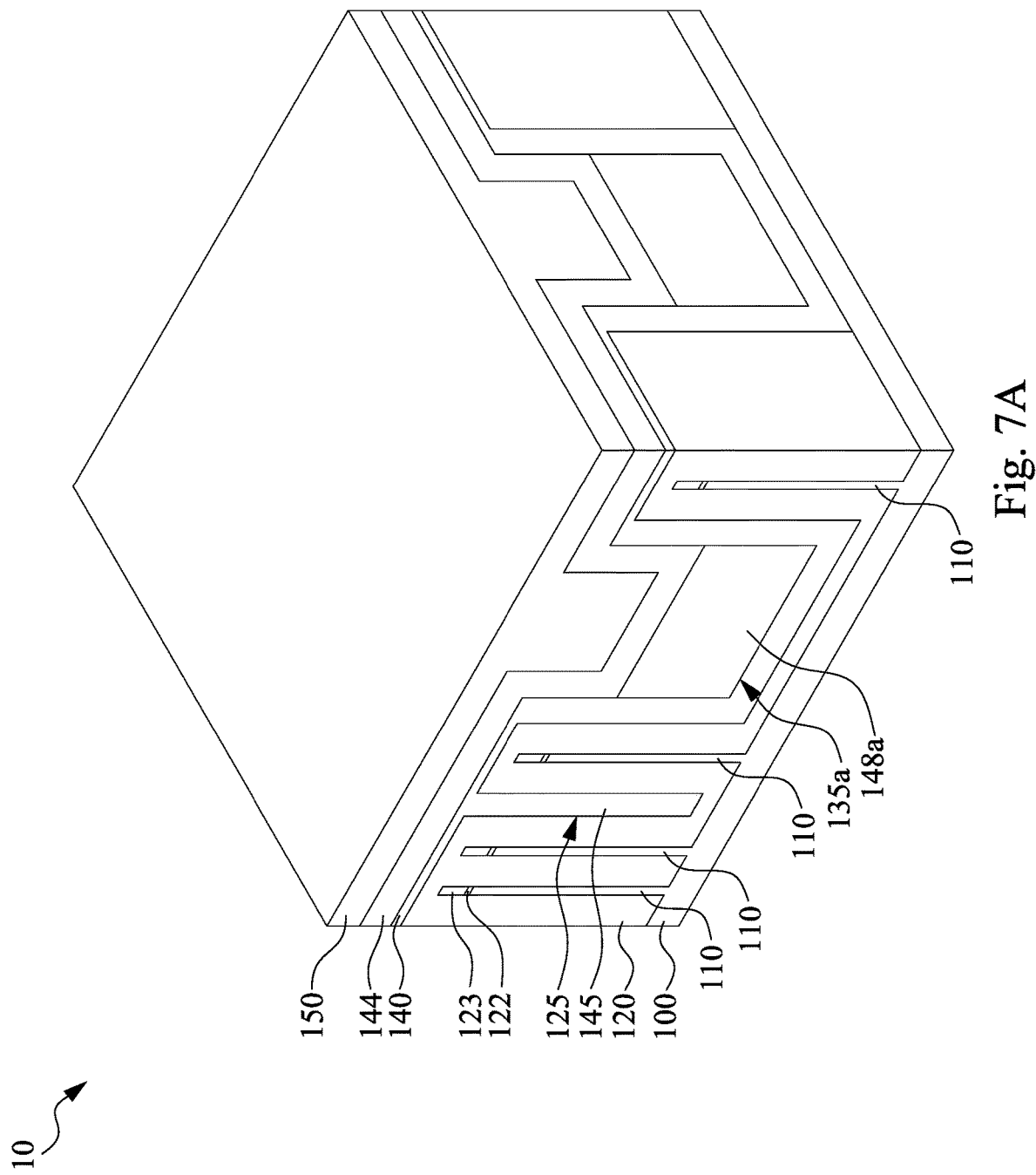
Figure 7B:
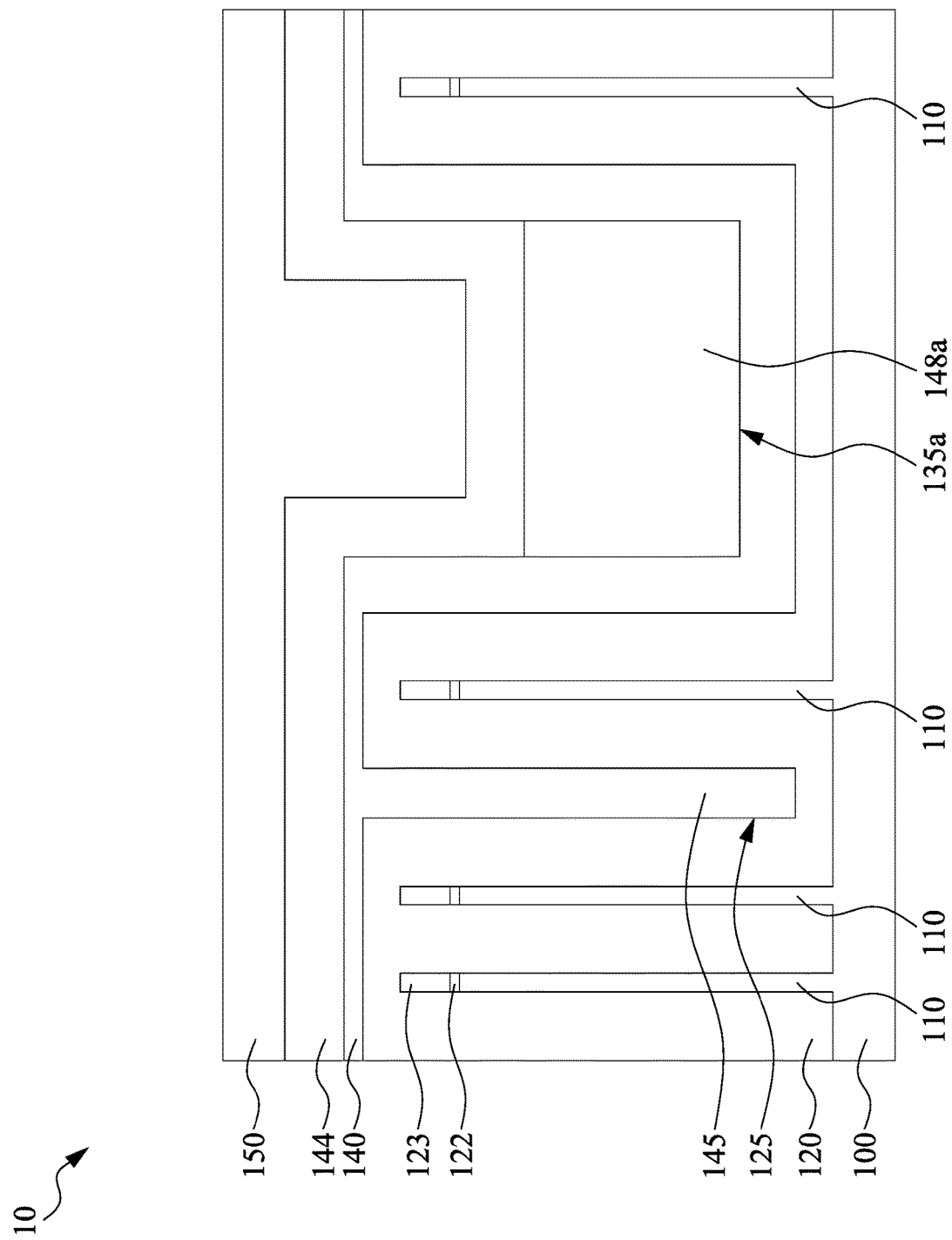

Reference is made to FIGS. 7A and 7B. A dielectric layer 144 is formed conformally over the dielectric layer 140 and the recesses 135a. The recess 135a after being covered by the dielectric layer 144 still forms a concave top surface. Another oxide layer 150 is formed over the dielectric layer 144 and filled into the concave top surface of the dielectric layer 144 such that a substantially flat top surface may be formed. The oxide layer 150 may be formed by the same process as the oxide layer 148, eg., flowable chemical vapor deposition (FCVD) process or different process.

Figure 8A:
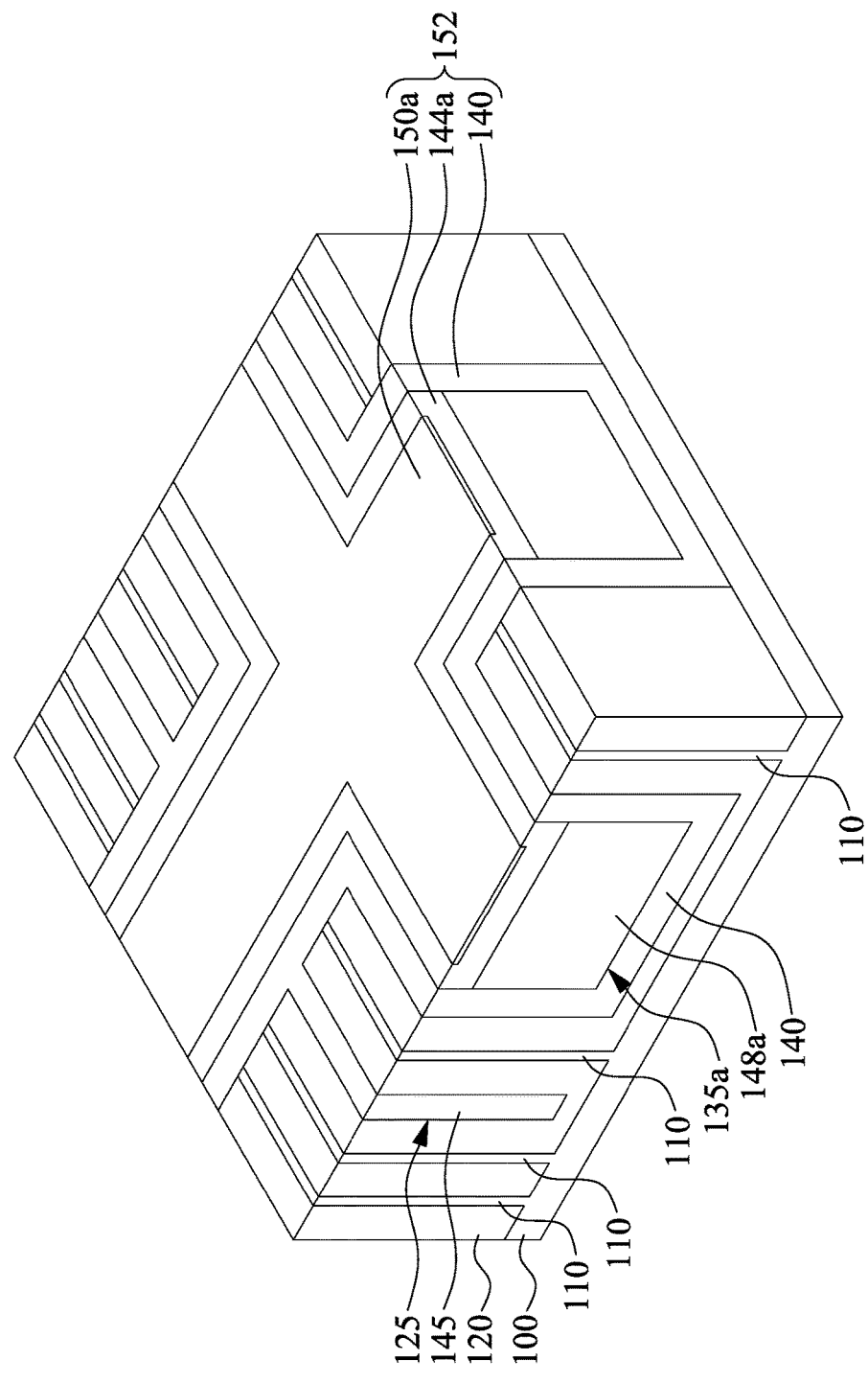
Figure 8B:
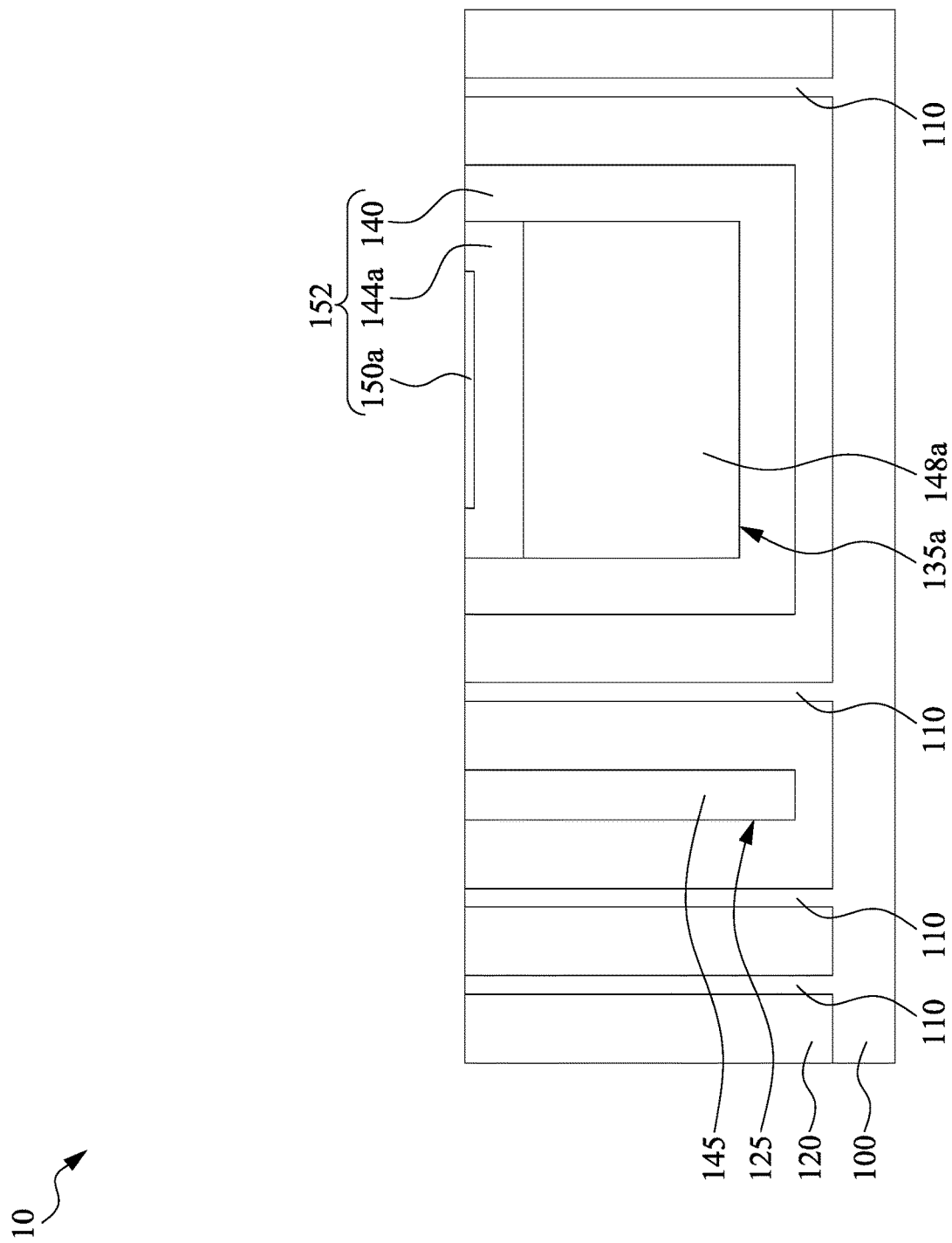

Reference is made to FIGS. 8A and 8B. Then, a chemical-mechanical planarization (CMP) process is performed to remove the excessive oxide layer 150 and dielectric layers 140, 144 until the semiconductor fins 110 are exposed. After the CMP process, a substantially flat top surface is formed over the semiconductor fins 110, the dummy fins 145, the dielectric layers 140 and 144a, and the remained oxide layer 150a. That is, top surfaces of the semiconductor fins 110 and top surfaces of the dielectric layers 140 and 144a are substantially coplanar, and top surfaces of the semiconductor fins 110 and a top surface of the dummy fin 145 are substantially coplanar.

In some embodiments, a dual helmet structure 152 including the remained oxide layer 150a, the remained dielectric layer 144a and a top portion of the dielectric layer 140 may be used as a CMP stop feature. Compared with using merely the dielectric layers 144a and 140 as the CMP stop feature, the dual helmet structure 152 with an oxide scheme, i.e., the remained oxide layer 150a, is a CMP favored feature due to less CMP process end point curve noise (e.g., CMP end point signal noise). That is, a clear CMP end point signal is obtained due to the dual helmet structure 152 with a large oxide surface, e.g., a by-product generated by the fin 110 top materials, low k dielectric materials (e.g. 140 and 144), the remained oxide layer 150a and a CMP slurry may serve as the CMP stop favored feature.

After the CMP process, the semiconductor fins 110 are exposed with the pad layers 122 and the mask layers 123 removed, and all top surfaces of the semiconductor fins 110 may be substantially coplanar.

Figure 9A:
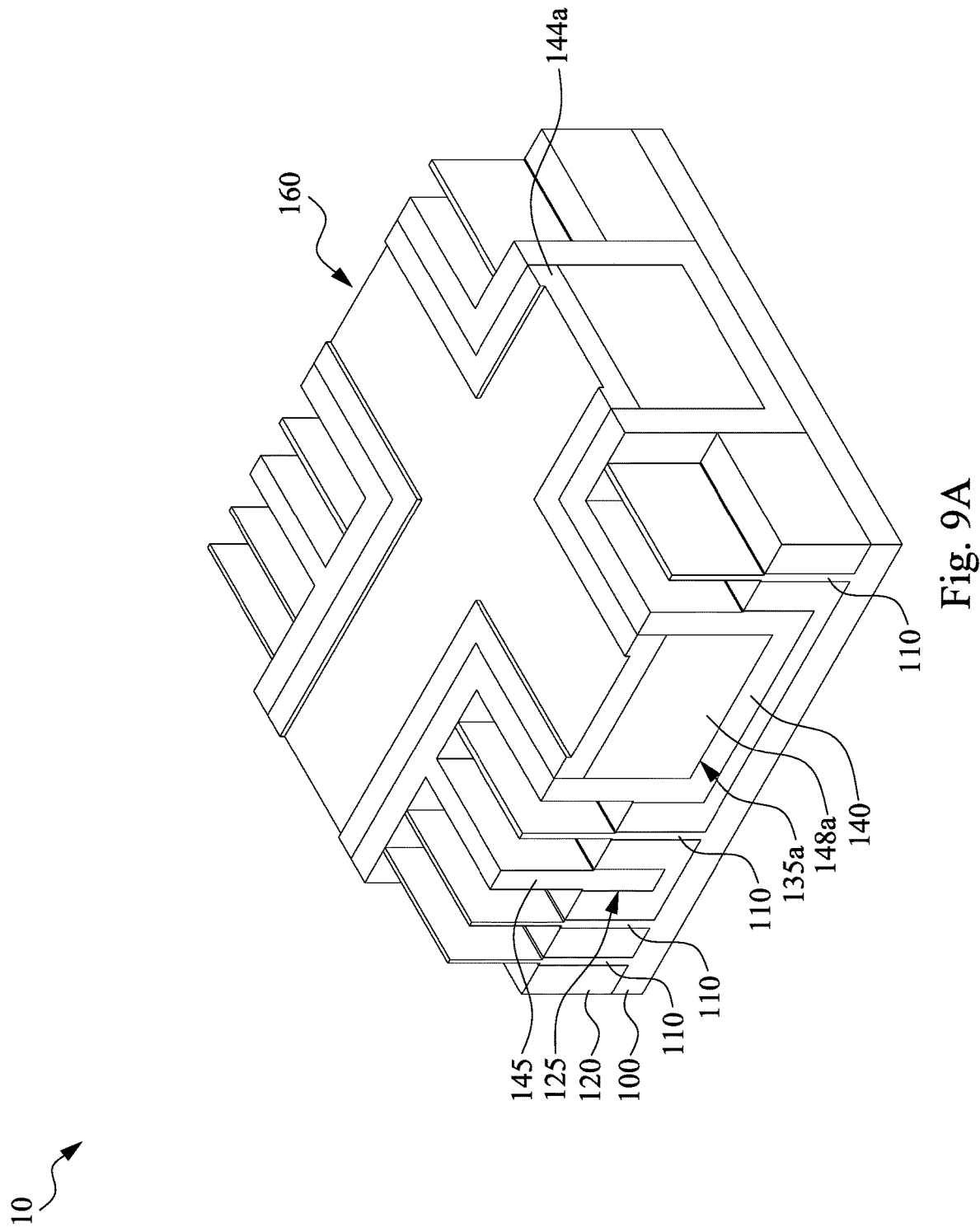
Figure 9B:
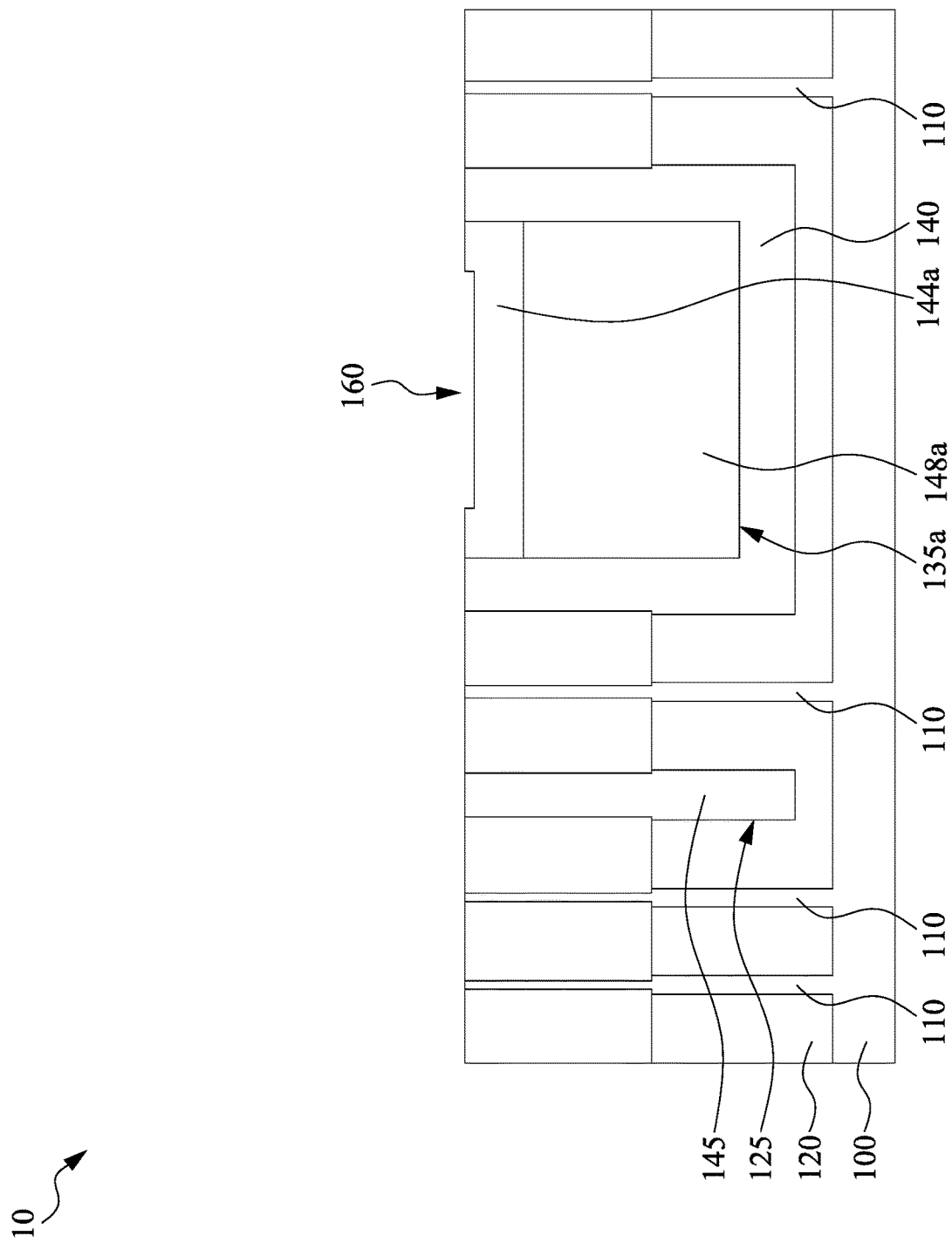

Reference is made to FIGS. 9A and 9B. One or more etching process(es) are performed to remove the remained oxide layer 150a and at least part of the liner or spacer layers 120 between adjacent semiconductor fins 110 and/or between the semiconductor fin 110 and the dummy fin 145. An enough height of each semiconductor fin 110 is exposed after performing the etching process(es). In some embodiments, the etching process(es) may be performed until top surfaces of the remained liner or spacer layers 120 may be below a top surface of the remaining silicon oxide 148a. In some embodiments, the liner or spacer layers 120 may be referred as a isolation structure.

After performing the etching process(es), a second dielectric stage 160 with a dielectric concave top portion is formed within an isolation area and between the semiconductor fins 110. In some embodiments, the dielectric stage 160 may have a cross-shaped concave top portion. In other embodiments, the dielectric stage 160 may include an oxide dielectric core (e.g., the silicon oxide 148a) and a non-oxide dielectric layer (e.g., 140 and 144a) entirely wrapping the oxide dielectric core. In other embodiments, the oxide dielectric core may be made from a flowable oxide. In other embodiments, the dielectric layer 140 surrounding the dielectric stage 160 and the dummy fin 145 may be made from the same materials by the same deposition process. In other embodiments, the dielectric layer 144a on top of the silicon oxide 148a may be made from materials different from the dielectric layer 140. The dielectric layer 144a may be referred as a helmet layer for the dielectric stage 160. In other embodiments, the dielectric layer 144a on top of the silicon oxide 148a may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 10A:
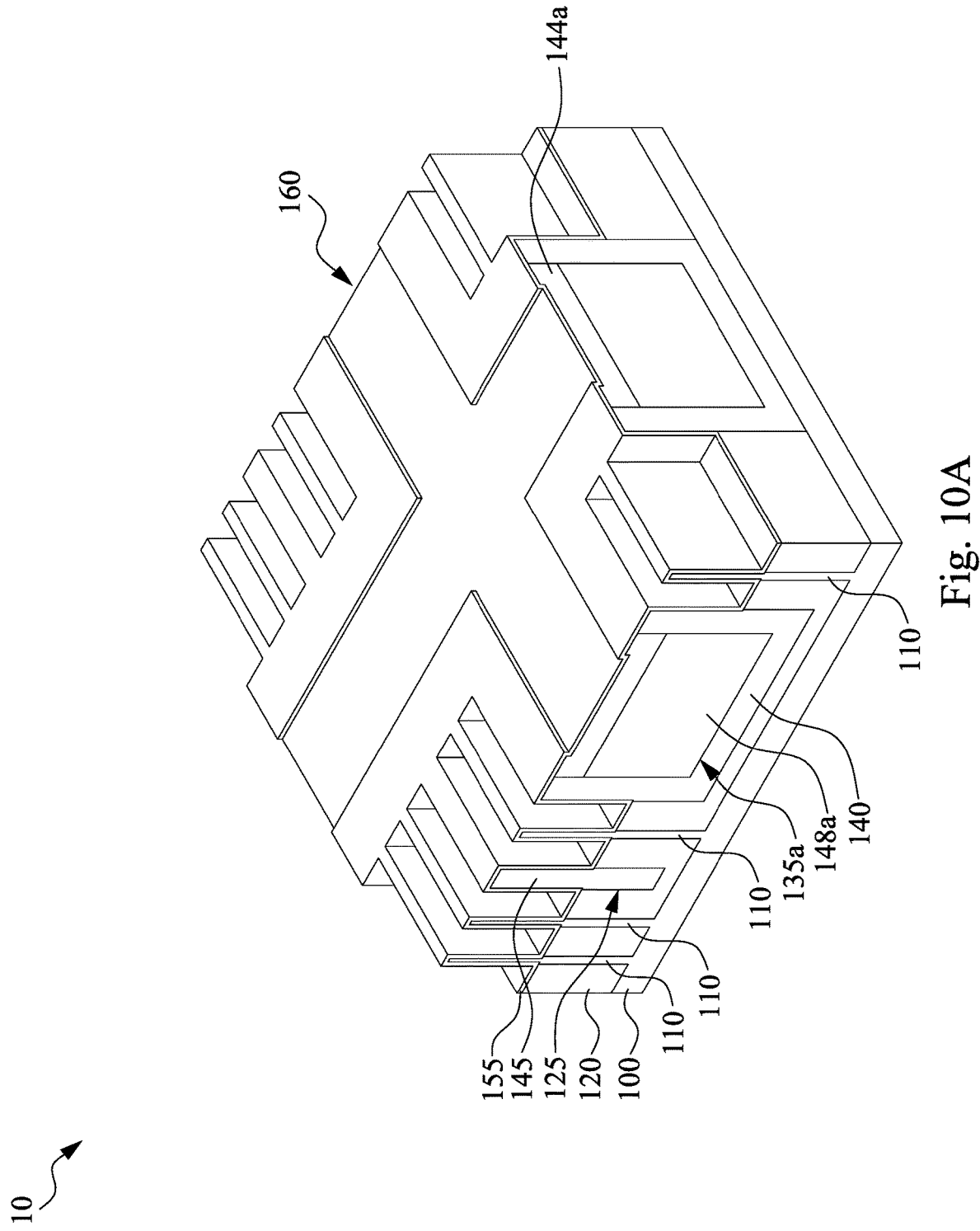
Figure 10B:
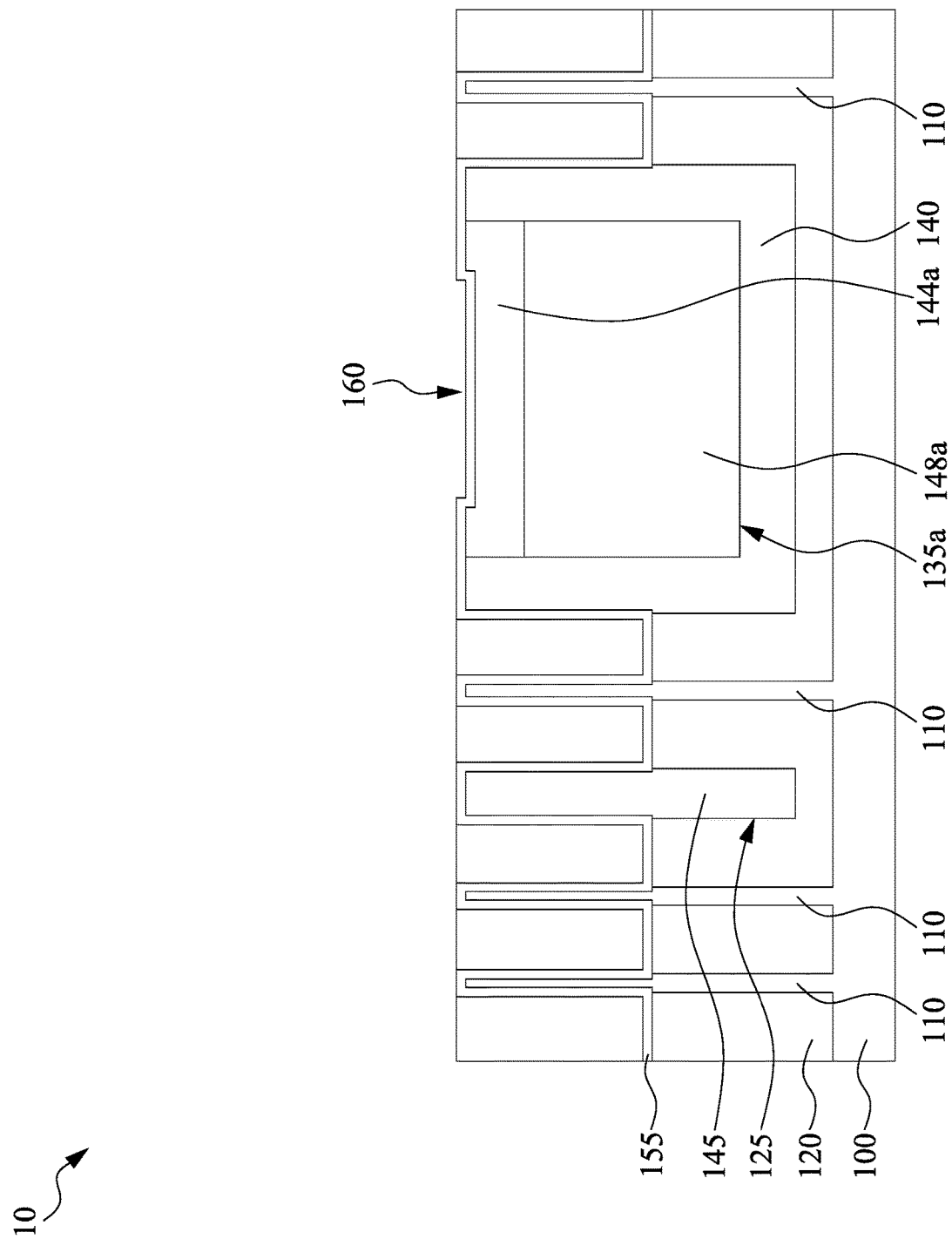

Reference is made to FIGS. 10A and 10B. A thin oxide layer 155 is formed over a top surface of the dielectric stage 160, outer surfaces of the semiconductor fins 110 and an outer surface of the dummy fin 145. The oxide layer 155 may act as gate dielectric in later process.

Figure 11A:
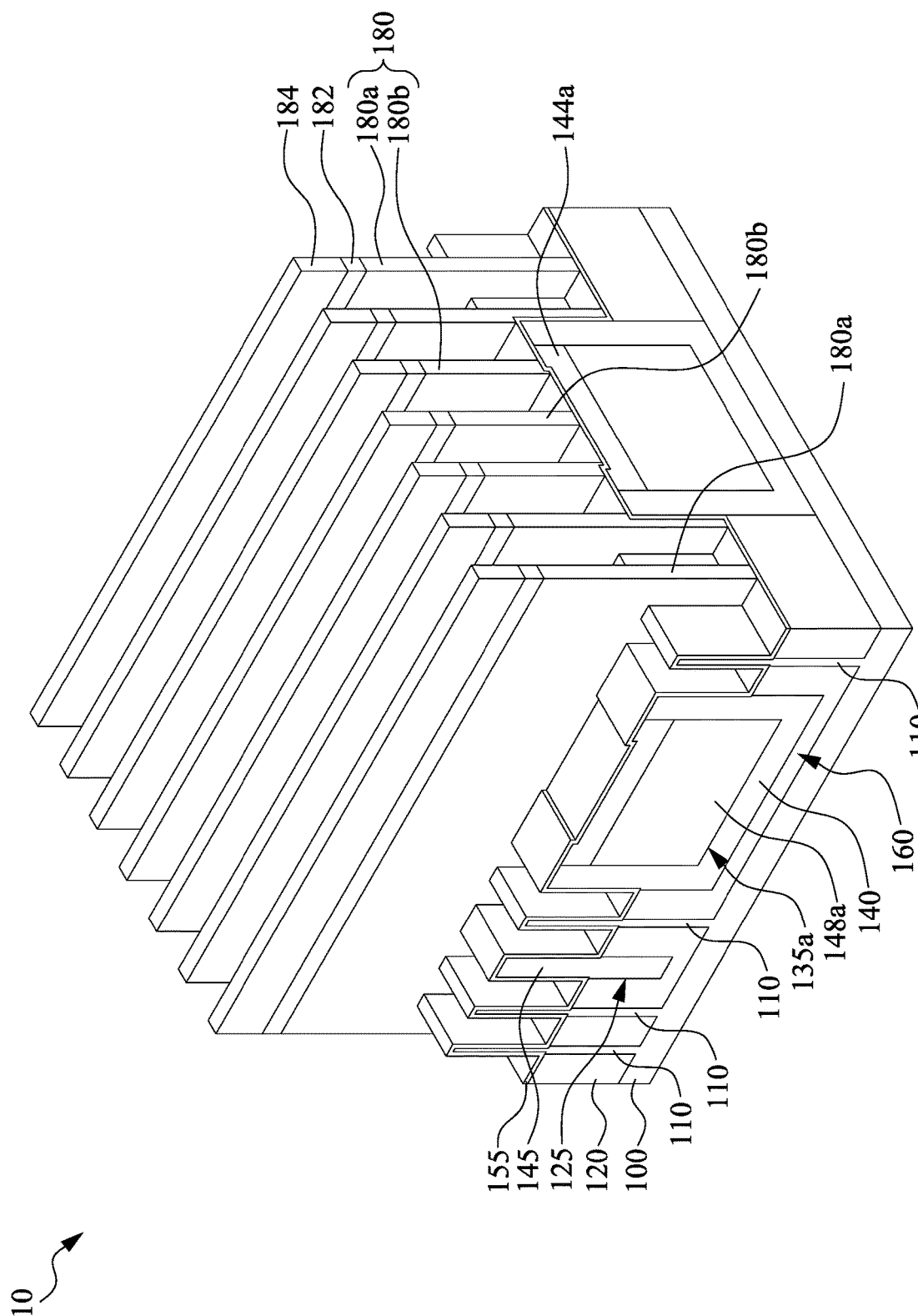
Figure 11B:
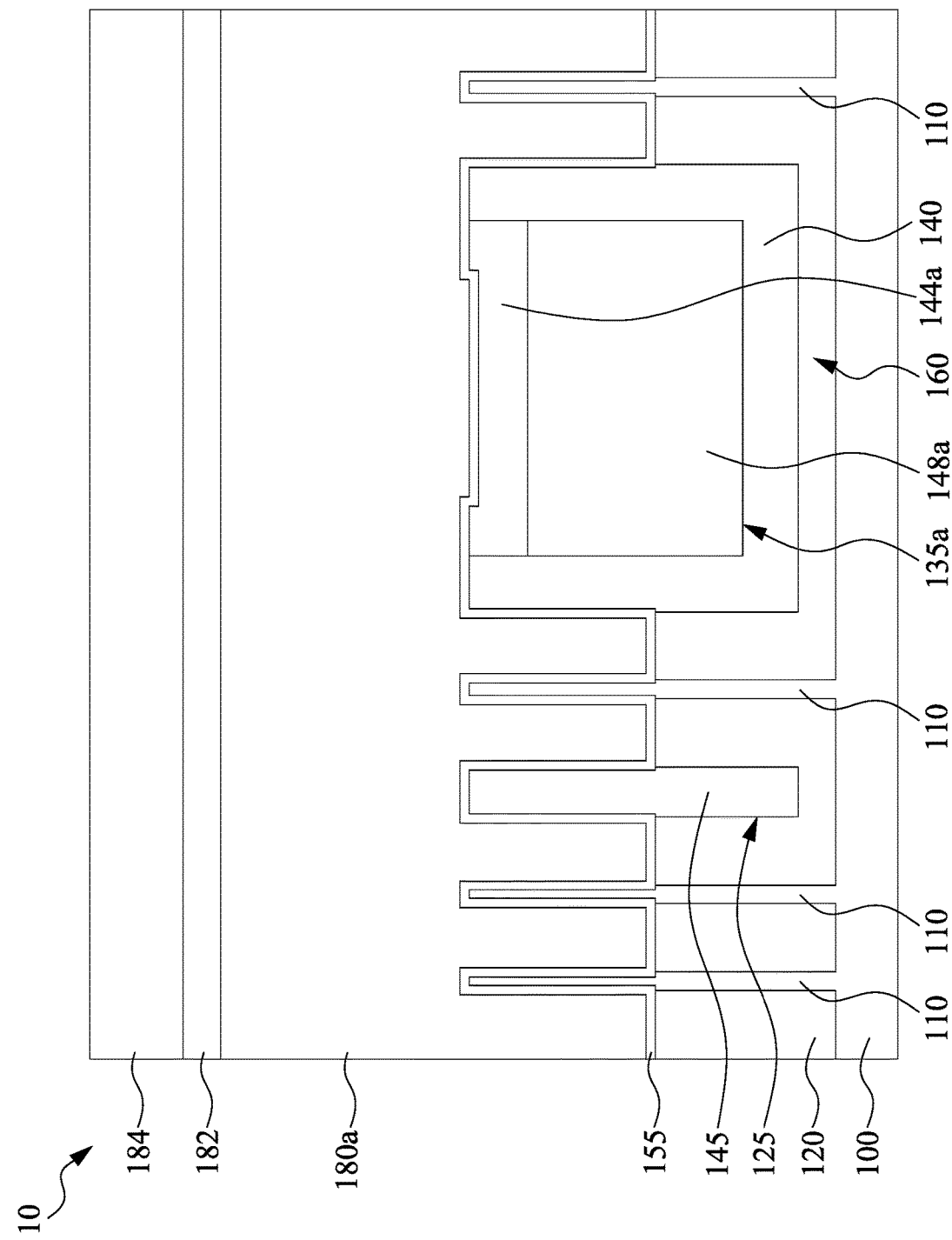

Reference is made to FIGS. 11A and 11B. Plural dummy gates 180 are formed over the oxide layer 155, in which the dummy gates 180a cross the semiconductor fins 110, the dummy fin 145 and the dielectric stage 160, and the dummy gates 180b cross the dielectric stage 160. The dielectric stage 160 anchors the dummy gates 180 on the isolation area to avoid the risk of dummy gate collapse due to a high aspect ratio. Without the dielectric stage 160, the dummy gates 180b may be patterned with a high aspect ratio and have a relatively high risk of collapse.

In some embodiments, the dummy gates 180b may stand within a concave area of the dielectric layer 144a (part of the dielectric stage 160). In some embodiments, the dummy gates 180b may have its bottom at least partially in contact with the concave area of the dielectric layer 144a (part of the dielectric stage 160).

Since the dielectric stage 160 has its top portion that is substantially level with top portions of the semiconductor fins 110 and the dummy fins 145 around, at least the dummy gates 180b are formed with a relatively small aspect ratio compared with that of the dummy gates formed on the substrate without the isolation structure (not shown in the drawings).

In some embodiments, mask layers 182 and 184 are formed over the dummy gates 180. The mask layers 182 and 184 acts as a hard mask during the patterning process of the dummy gates 180 and may act as a hard mask during the following processes, such as etching. In some embodiments, the mask layers 182 and 184 may include silicon oxide, silicon nitride and/or silicon oxynitride.

In some embodiments, the dummy gates 180 may include polycrystalline-silicon (poly-Si) or poly-crystalline silicon-germanium (poly-SiGe). Further, the dummy gates may be doped poly-silicon with uniform or non-uniform doping. In some embodiments, the dummy gates 180 may be formed by, for example, forming a dummy gate material layer over the oxide layer 155. Patterned masks, such as mask layers 182 and 184, are formed over the dummy gate material layer. Then, the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the oxide layer 155 until the semiconductor fins 110 and the dummy fin 145 are exposed.

Figure 12A:
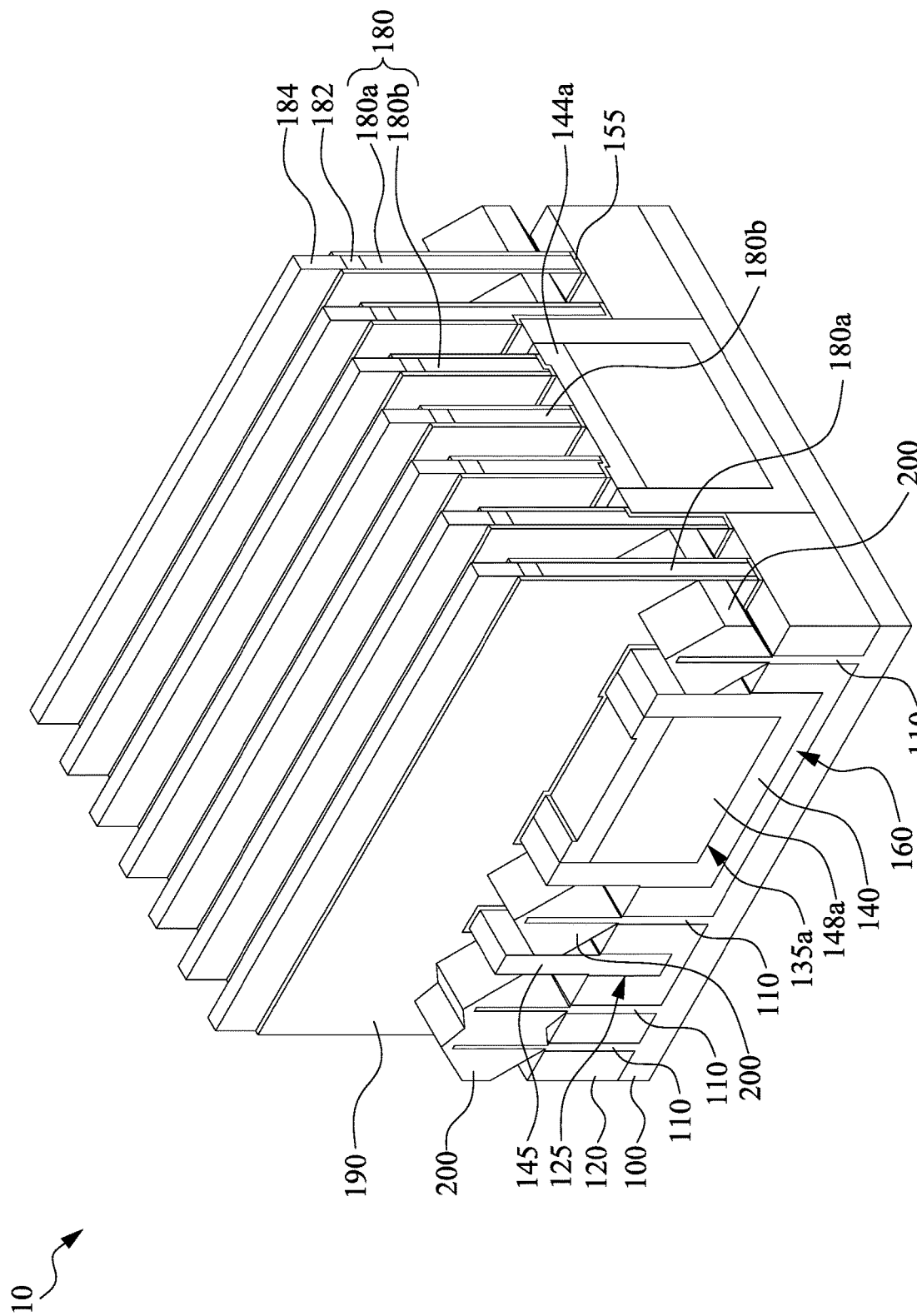
Figure 12B:
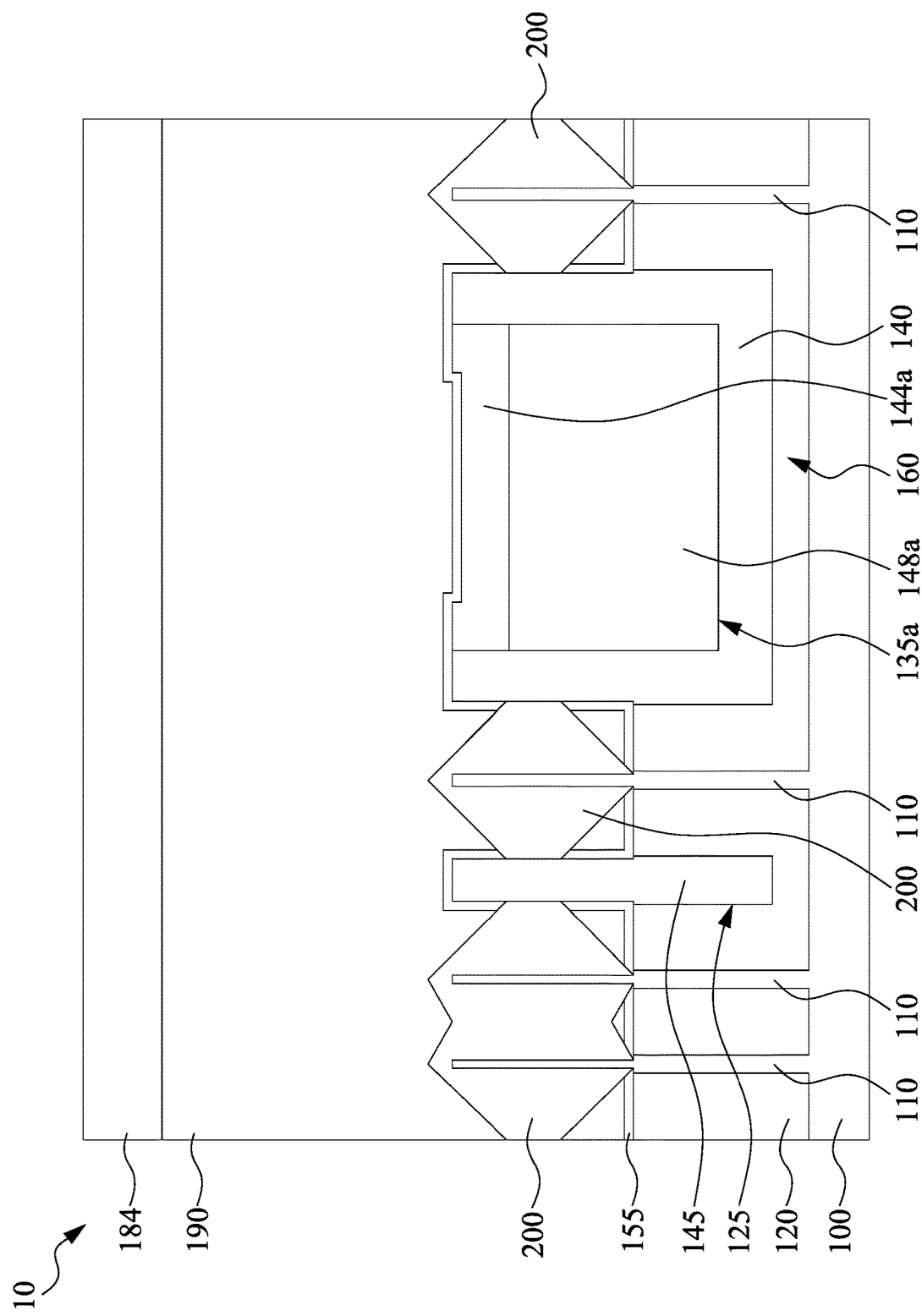

Reference is made to FIGS. 12A and 12B. Gate spacer structures including plural gate spacers 190 on opposite sidewalls of the dummy gates 180 are formed. In some embodiments, at least one of the gate spacers 190 includes single or multiple layers. The gate spacers 190 can be formed by blanket depositing one or more dielectric layer(s) on the previously formed structure. The dielectric layer(s) may include silicon nitride (SiN), oxynitride, silicon carbon (SiC), silicon oxynitride (SiON), oxide, and the like. The gate spacers 190 may be formed by methods such as CVD, plasma enhanced CVD, sputter, or the like. The gate spacers 190 may then be patterned, such as by one or more etch processes to remove horizontal portions of the gate spacers 190 from the horizontal surfaces of the structure.

The oxide layer 155 exposed from the dummy gates 180 and the gate spacers 190 are removed by suitable process, such as etching. The remained portions of the oxide layer 155 are disposed under the dummy gates 180 and the gate spacers 190. Thus, the remained portions of the oxide layer 155 may be referred to as gate dielectric. Also, the dummy gate 180 and the remained oxide layer 155 may collectively be referred to as a dummy gate stack.

Portions of the semiconductor fins 110 and the dummy fins 145 are exposed after the oxide layer 155 are partially removed. Then, plural source/drain features 200 are respectively formed over the exposed semiconductor fins 110 of the substrate 100. In some embodiments, the adjacent source/drain features 200 are spaced by and in contact with the dummy fin 145 such that the formation of the source/drain features 200 are easily to be controlled.

In some embodiments, the source/drain features 200 may be epitaxy structures, and may also be referred to as epitaxy features 200. The source/drain features 200 may be formed using one or more epitaxy or epitaxial (epi) processes, such that Si features, SiGe features, and/or other suitable features can be formed in a crystalline state on the semiconductor fins 110. In some embodiments, the source/drain features 200 may be cladding over the semiconductor fins 110.

In some embodiments, lattice constants of the source/drain features 200 are different from lattice constants of the semiconductor fins 110, such that channels in the semiconductor fins 110 are strained or stressed to enable carrier mobility of the semiconductor device and enhance the device performance. In some embodiments, the source/drain features 200 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon). The source/drain features 200 may be in-situ doped. The doping species include P-type dopants, such as boron or $BF_2$; N-type dopants, such as phosphorus or arsenic; and/or other suitable dopants including combinations thereof. If the source/drain features 200 are not in-situ doped, a second implantation process (i.e., a junction implant process) is performed to dope the source/drain features 200. One or more annealing processes may be performed to activate the source/drain features 200. The annealing processes include rapid thermal annealing (RTA) and/or laser annealing processes.

In some embodiments, the source/drain features 200 over the semiconductor fins 100 may include the same doping-type, and the source/drain feature 200 over one of the semiconductor fins 100 may include doping-type different from that of the source/drain features 200 over the other of the semiconductor fins 100. For example, some source/drain features 200 may be n-type, and the other source/drain features 200 may be p-type, and vise versa.

Figure 13A:
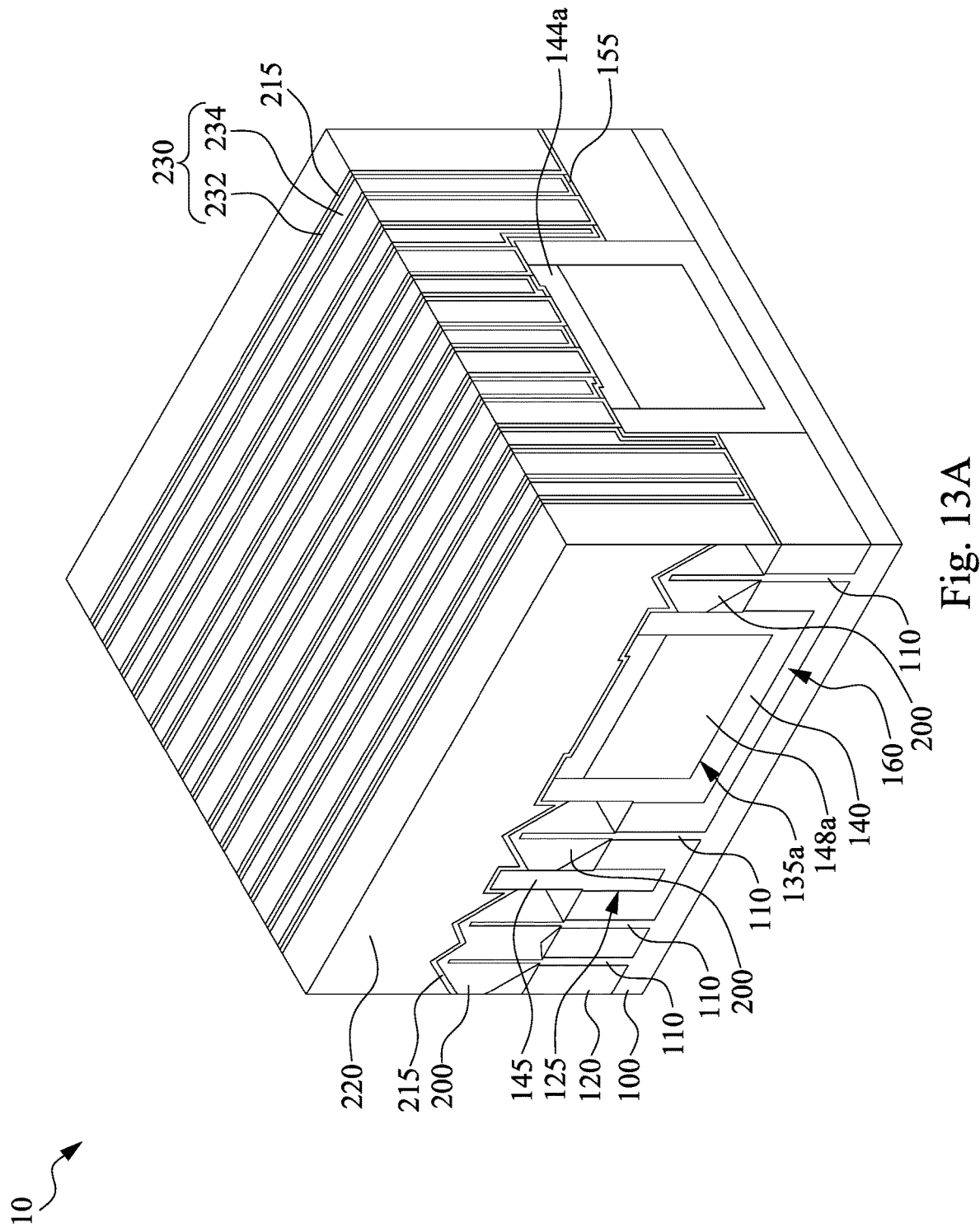
Figure 13B:
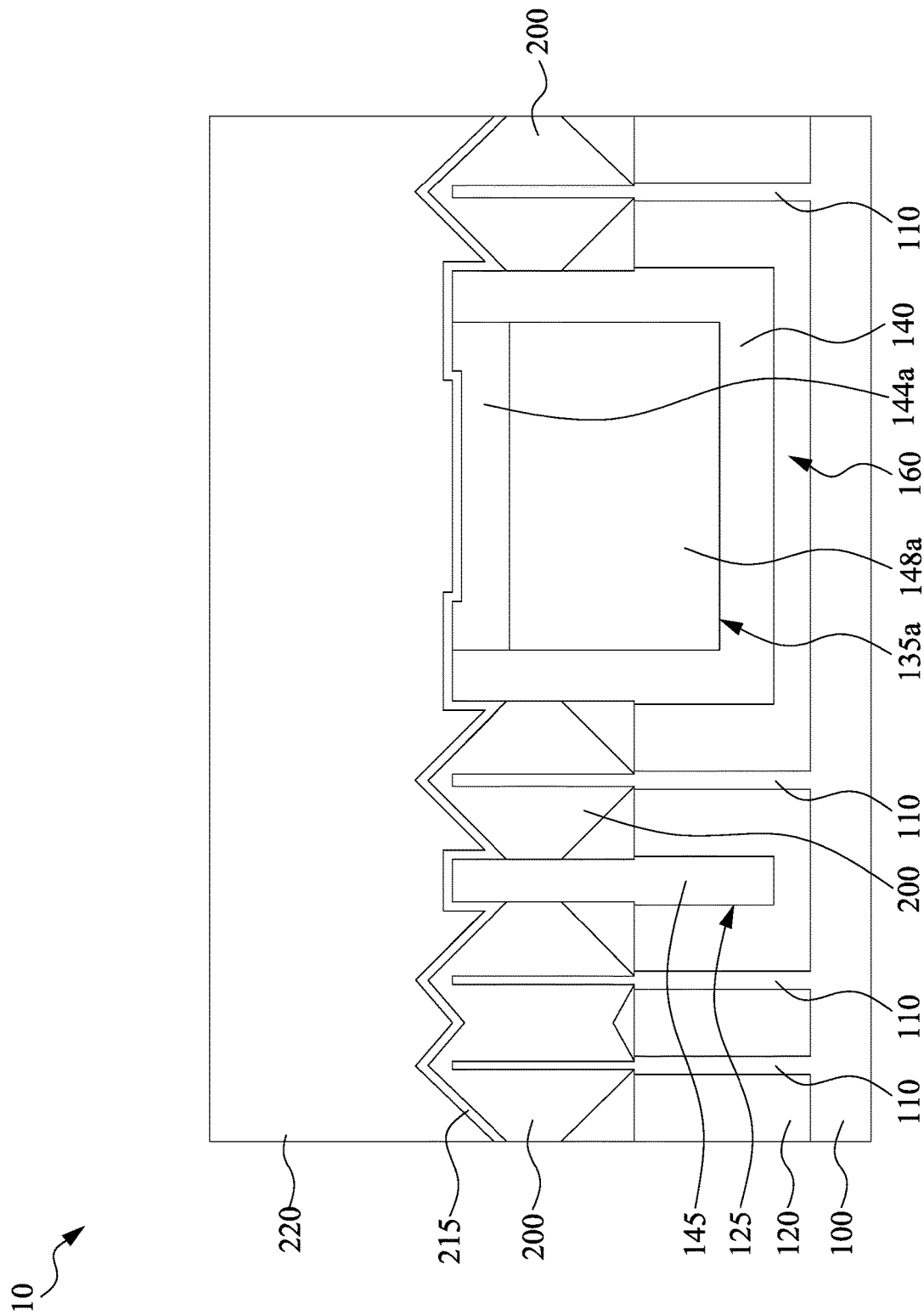

Reference is made to FIGS. 13A and 13B. An etching stop layer 215 and interlayer dielectric 220 is formed over the dielectric stage 160, the substrate 100 and covers the source/drain features 200. Then, a CMP process is performed to remove the excessive interlayer dielectric 220, and the mask layers 182 and 184 (referring to FIGS. 11A and 11B) until the dummy gates 180 are exposed.

In some embodiments, the interlayer dielectric 220 may include silicon nitride, silicon oxynitride, silicon oxycarbonitride, silicon carbide, silicon germanium, or combinations thereof. The interlayer dielectric 220 may be formed by a suitable technique, such as CVD, ALD and spin-on coating. In some embodiments, air gaps may be created in the interlayer dielectric 220.

Then, a replacement gate (RPG) process scheme is employed. The dummy gate stacks 185 are replaced with gate stacks 230. For example, the dummy gate stacks 185 are removed to from a plurality of gate trenches. The dummy gate stacks 185 are removed by a selective etch process, including a selective wet etch or a selective dry etch, and carries a substantially vertical profile of the gate spacers 190. The gate trenches expose portions of the semiconductor fins 110 and 210 of the substrate 100. Then, the gate stacks 230 are formed respectively in the gate trenches and cover the semiconductor fins 110 and 210 of the substrate 100. The gate stacks 230 may be also referred as the gate structures.

The gate stacks 230 include an interfacial layer (not shown), gate dielectrics 232 formed over the interfacial layer, and gate metals 234 formed over the gate dielectrics 232. The gate dielectrics 232, as used and described herein, include dielectric materials having a high dielectric constant, for example, greater than that of thermal silicon oxide (~3.9). The gate metals 234 may include a metal, metal alloy, and/or metal silicide.

In some embodiments, the gate metals 234 included in the gate stacks 230 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 234 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectrics 232 may include a high-K dielectric layer such as hafnium oxide ($HfO_2$). Alternatively, the gate dielectric 212 may include other high-K dielectrics, such as $TiO_2$, HfZrO, $Ta_2O_3$, $HfSiO_4$, $ZrO_2$, $ZrSi_{O2}$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 232 may be formed by ALD, PVD, CVD, oxidation, and/or other suitable methods.

Figure 14A:
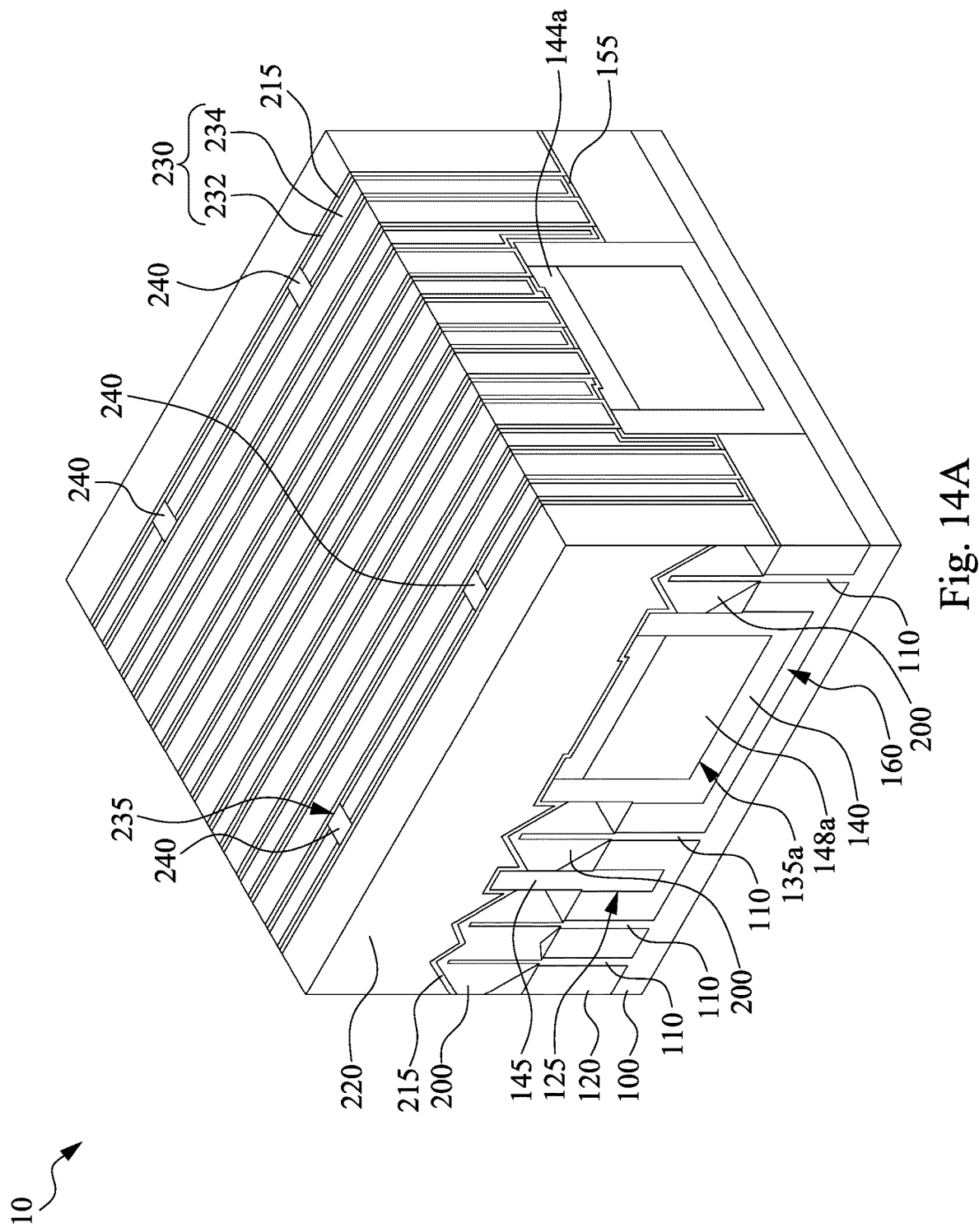
Figure 14B:
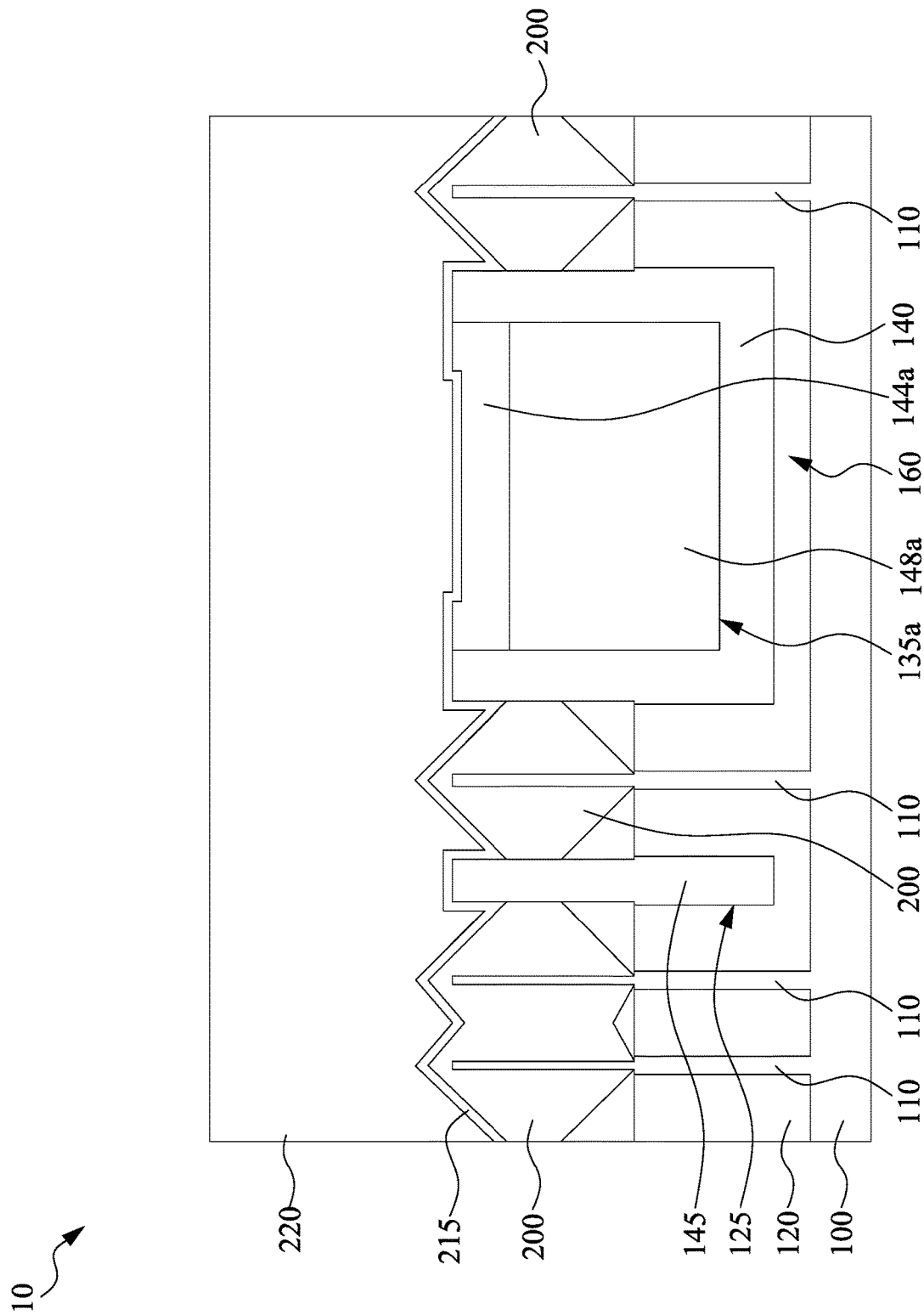

Reference is made to FIGS. 14A and 14B. An etching process is performed to remove portions of the gate stacks 230. During the etching process, plural openings 235 are formed in the gate stacks 230. In some embodiments, the openings 235 may expose at least portions of the dummy fin 145 and the dielectric layer 144a (part of the dielectric stage 160), as shown in FIG. 15C. Then, plural isolation features 240 are formed in the openings 235. In some embodiments, the isolation features 240 may be formed by depositing a dielectric layer blanketing the substrate 100. Then, a CMP process is performed to remove the excessive dielectric layer until the gate stacks 230 are exposed. Some of the isolation features 240 are in contact with the dielectric layer 144a and the dummy fin 145. The gate stack 230 with the isolation features 240 may be divided into separate parts, as shown in FIG. 15C. The isolation features may also be referred as gate isolation structures.

Figure 15A:
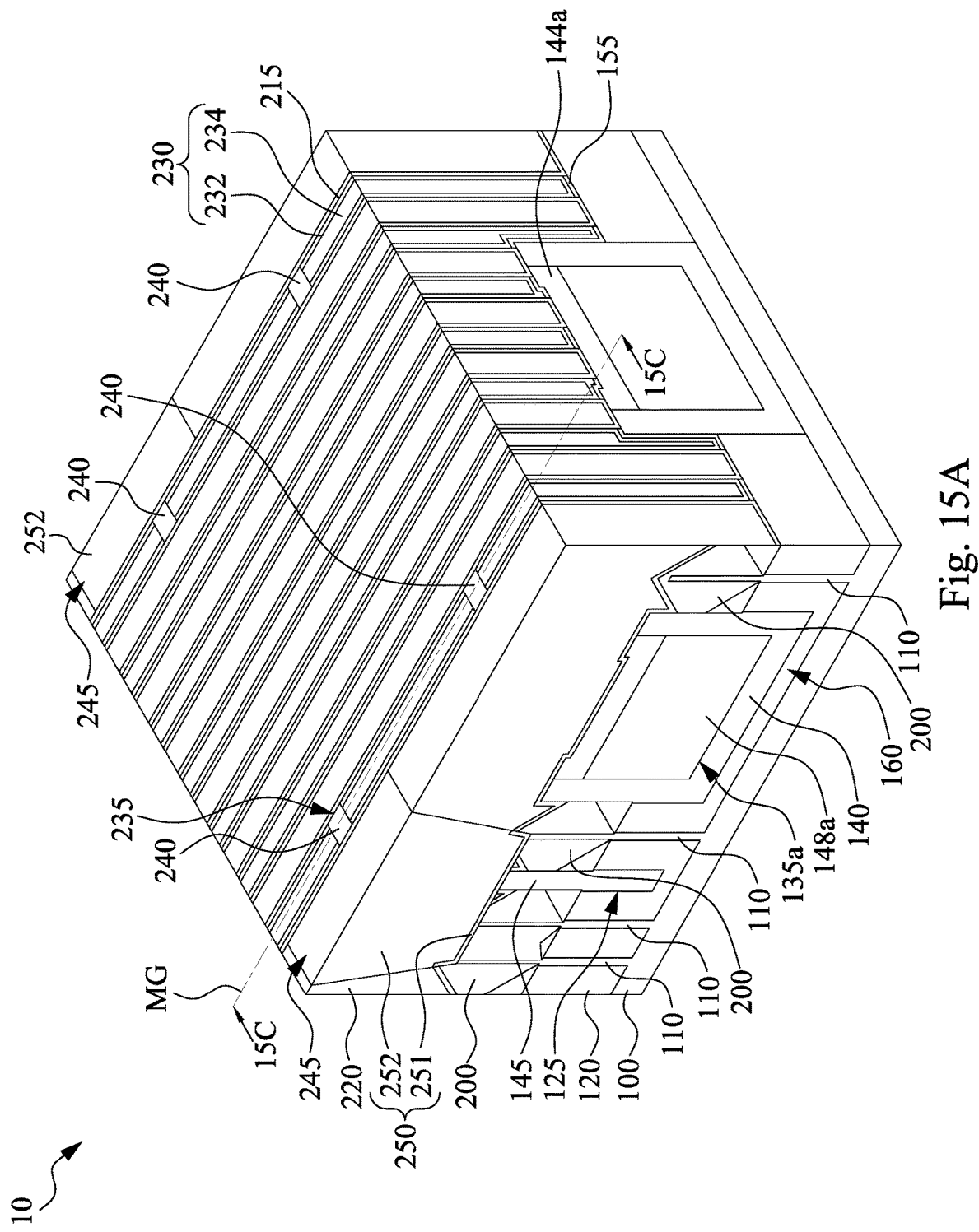
Figure 15B:
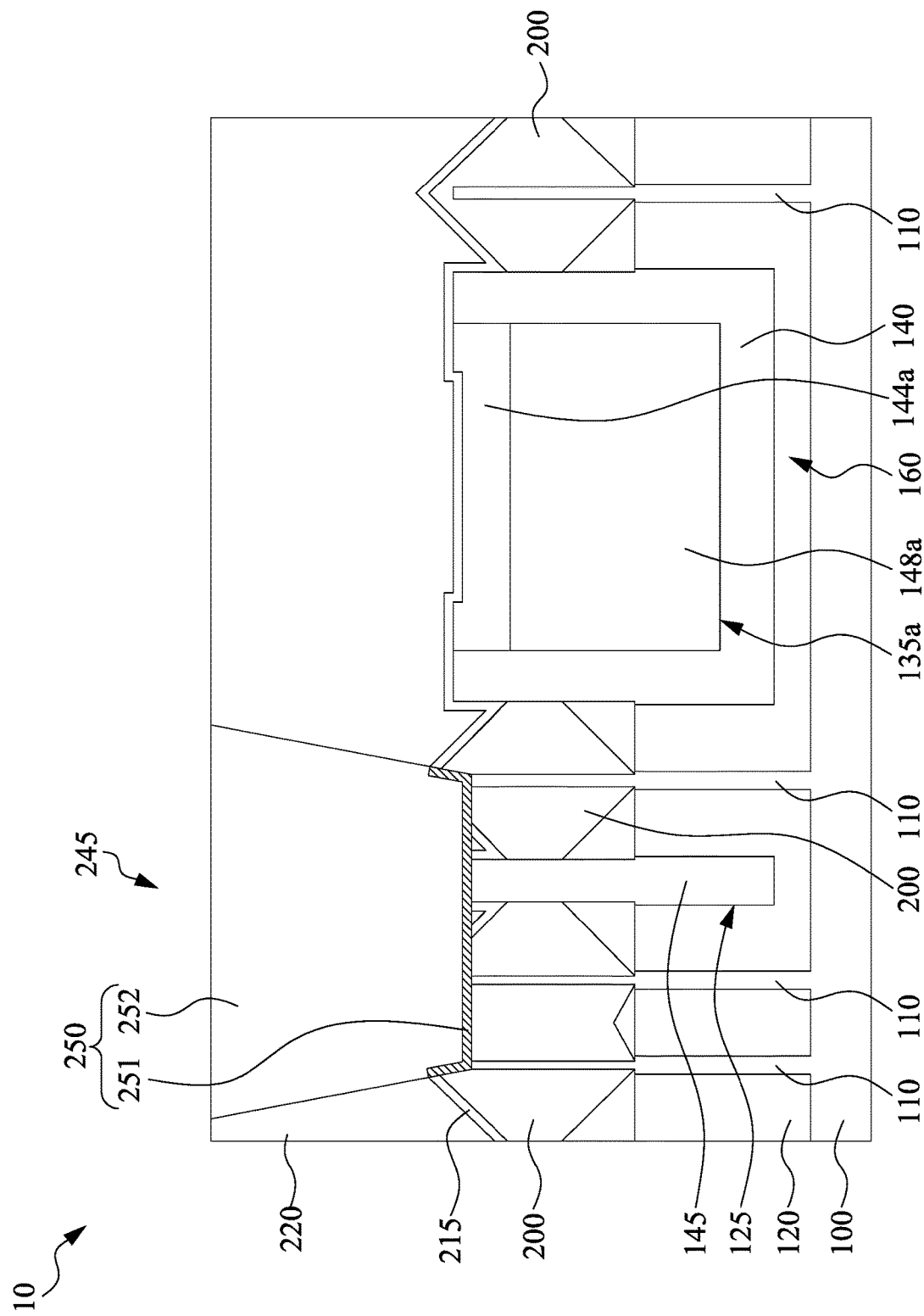
Figure 15C:
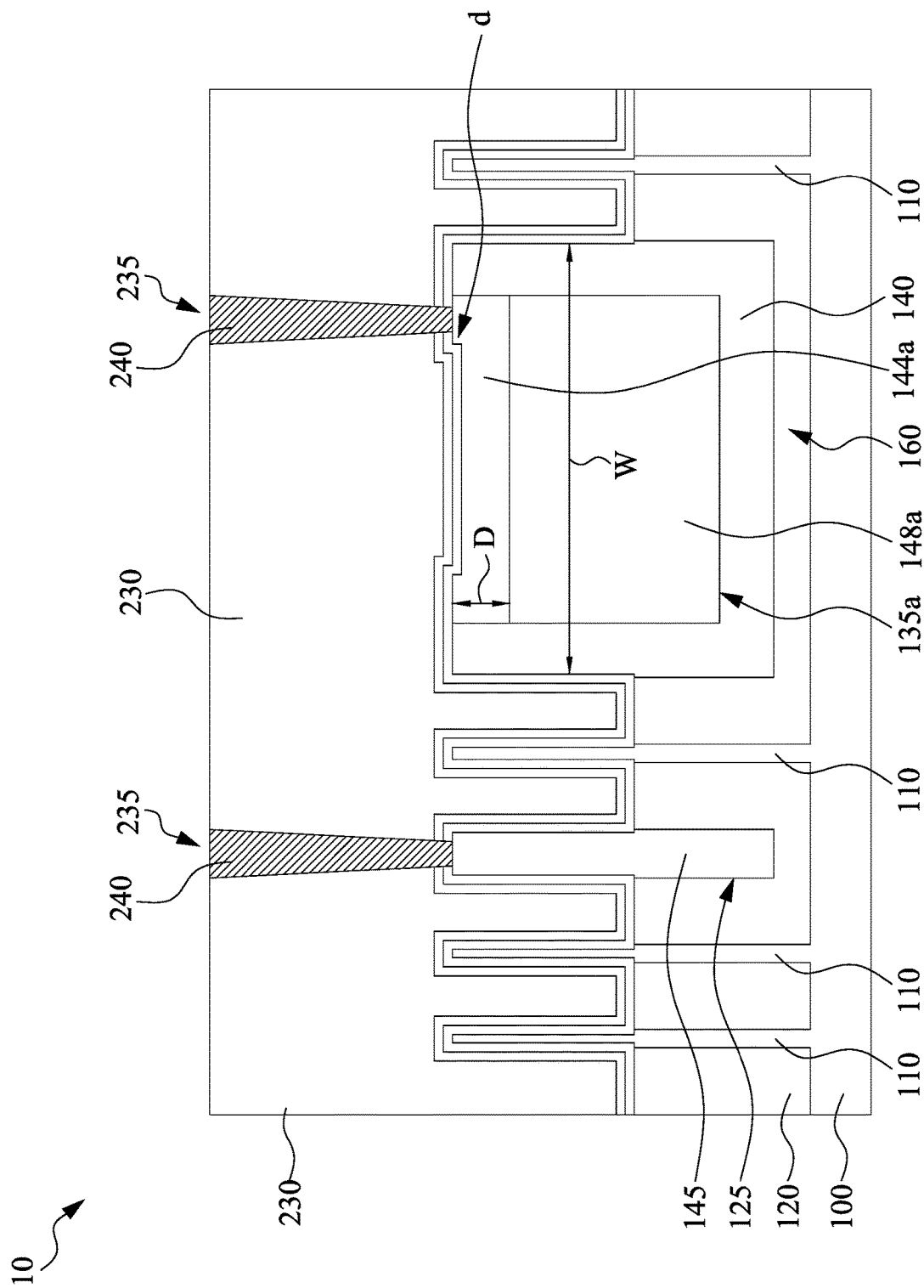
FIG. 15C is a cross-sectional view taken along the metal gate direction MG of FIG. 15A.

Reference is made to FIGS. 15A and 15B. An etching process is performed to remove portions of the interlayer dielectric 220. Thus, plural openings 245 are formed in the interlayer dielectric 220 and the etching stop layer 215 to expose the source/drain features 200 and the dummy fins 145.

Then, plural contacts 250 are formed in the openings 245. The contacts 250 may be formed by depositing a conductive material layer over the substrate 100 and following with a CMP process until the gate stacks 230 are exposed. In some embodiments, the contacts 250 are in contact with the source/drain features 200 and the dummy fins 145. For example, in FIG. 15B, the contact 250 is in contact with the source/drain features 200 over the semiconductor fins 110, and is in contact with the dummy fins 145 between the semiconductor fins 110. The dummy fin 145 can support the contact 250, such that the contact 250 does not extend further into a space between the source/drain features 200. In some embodiments, at least one of the contacts 250 includes a barrier layer 251 and conductive layer 252. In some embodiments, the source/drain features 200 have their sidewalls in contact with the dielectric layer 40 and the dummy fin 145. In some embodiments, the conductive layer 252 may include suitable metal, such as TiN, WN, TaN, or Ru, which performs in a p-type FinFET. In some alternative embodiments, the metal layer may include suitable metal, such as Ti, Ag, Al, TiAl, TlAlN, TiAlC, TiAlCN, TaC, TaCN, TaSiN, Mn, or Zr, which performs in an n-type FinFET. In some other embodiments, the contacts 250 may be multi-layer including, work function layers, liner layers, interface layers, seed layers, adhesion layers, barrier layers and so on.

Reference is made to FIG. 15C, which is a cross-sectional view taken along the metal gate direction MG of FIG. 15A. In some embodiments, one isolation feature 240 is in contact with the dummy fin 145 while another isolation feature 240 is in contact with a top surface of the dielectric stage 160, e.g., a top surface of the dielectric layer 144a such that the gate stack 230 may be divided into separate parts. In some embodiments, the dielectric stage 160 has a helmet layer (i.e., 144a) with a thinner portion and two thicker portions with the helmet depth (D), and the thinner portion is coupled between the two thicker portions with the helmet depth (D). A thickness difference between the thinner portion and the thicker portion is referred as the concave depth (d). In some embodiments, a top surface of the helmet layer (i.e., 144a) is higher than a top surface of the liner or spacer layer 120 (i.e., an isolation structure). In some embodiments, the dielectric concave top portion of the dielectric stage 160 may be equipped with a total helmet depth (D) ranging from about 15 nm to about 80 nm in order to cover the oxide 148a underneath and anchor the dummy gates on its top surface. When the total helmet depth (D) is smaller than 15 nm, it may be easily etched and the oxide 148a underneath is thus exposed. In some embodiments, the dielectric concave top portion of the dielectric stage 160 may be equipped with a concave depth (d) ranging from about 3 nm to about 40 nm, and this depth (d) range may be easily formed on the helmet layer (i.e., 144a) along with the total helmet depth (D) ranging from about 15 nm to about 80 nm. In some embodiments, the dielectric layer 140 wrapping around the dielectric stage 160 may be equipped with a helmet width (W) greater than about 60 nm along the metal gate direction MG, i.e., a longitudinal direction of the gate stack. The helmet width (W) greater than about 60 nm is enough to allow a concave helmet layer (i.e., 144a) formed thereon with an oxide-filled that is favored for CMP semiconductor fins stop feature due.

In some embodiments, a top surface of the dielectric layer 140 is substantially coplanar with a top surface of the helmet layer (i.e., 144a). In some embodiments, a top surface of the dielectric layer 140 is substantially coplanar with top surfaces of the fins 110.

According to aforementioned embodiments, a semiconductor device includes a dielectric stage located over a substrate and between the semiconductor fins of the substrate. The dielectric stage has a concave shape helmet that is substantially coplanar with top surfaces of the semiconductor fins and allows dummy gates to be formed thereon. The dielectric stage may include an oxide dielectric core and a non-oxide dielectric layer wrapping the oxide dielectric core, and the oxide dielectric core may be a flowable oxide. With such configurations, the dielectric stage anchors the dummy gates on its top surface to avoid the risk of dummy gate collapse due to a high aspect ratio. Also, the concave helmet with an oxide-filled within the concave part is CMP favored due to less CMP end point curve noise, and the oxide surface is favored for CMP semiconductor fins stop feature.

An embodiment of the present disclosure is a semiconductor device having a substrate and first, second fins, an isolation structure between the first and second fins, a dielectric stage in the isolation structure, and a helmet layer over the dielectric stage. A top surface of the helmet layer is higher than a top surface of the isolation structure.

An embodiment of the present disclosure is that the helmet layer has a first portion, a second portion, and a third portion, the first portion connects the second portion and the third portion, and each of the second portion and the third portion is thicker than the first portion.

An embodiment of the present disclosure is that a thickness of the second portion of the helmet layer is in a range from about 15 nm to about 80 nm.

An embodiment of the present disclosure is that a thickness difference between the first portion and the second portion of the helmet layer is in a range from about 3 nm to about 40 nm.

An embodiment of the present disclosure is the semiconductor device further including a dielectric dummy fin layer wrapping around the dielectric stage.

An embodiment of the present disclosure is that a top surface of the dielectric dummy fin layer is substantially coplanar with the top surface of the helmet layer.

An embodiment of the present disclosure is that a top surface of the dielectric dummy fin layer is substantially coplanar with a top surface of the first fin.

An embodiment of the present disclosure is the semiconductor device further including a gate structure over the first fin, the helmet layer, and the dielectric dummy fin layer.

An embodiment of the present disclosure is that a width of the dielectric dummy fin layer along a longitudinal direction of the gate structure is greater than about 60 nm.

An embodiment of the present disclosure is the semiconductor device further including a first epitaxy structure adjoining the first fin and in contact with the dielectric dummy fin layer.

An embodiment of the present disclosure is the semiconductor device further including a second epitaxy structure adjoining the second fin and in contact with the dielectric dummy fin layer.

An embodiment of the present disclosure is the semiconductor device further including a gate structure over the first fin and the helmet layer, and a gate isolation structure in the gate structure and landing on the helmet layer.

An embodiment of the present disclosure is a semiconductor device having first fin and second fins, a dielectric stage between an end surface of the first fin and an end surface of the second fin, a dielectric dummy fin layer wrapping around the dielectric stage, and a helmet layer over the dielectric stage.

An embodiment of the present disclosure is that a top surface of the dielectric dummy fin layer is substantially coplanar with a top surface of the first fin.

An embodiment of the present disclosure is that the dielectric dummy fin layer is in contact with the end surface of the first fin.

An embodiment of the present disclosure is that the dielectric dummy fin layer is in contact with the end surface of the second fin.

An embodiment of the present disclosure is a method for depositing a first dielectric layer over a first fin and a second fin; depositing a dielectric dummy fin layer over the first dielectric layer, wherein the dielectric dummy fin layer has a first portion over top surfaces of the first fin and the second fin; depositing a second dielectric layer over the dielectric dummy fin layer; removing a first portion of the second dielectric layer over a top surface of the first portion of the dielectric dummy fin layer, wherein a second portion of the second dielectric layer remains between the first fin and the second fin; recessing the second portion of the second dielectric layer; removing the first portion of the dielectric dummy fin layer, wherein a second portion of the dielectric dummy fin layer remains between the first fin and the second fin; depositing a helmet layer over the recessed second portion of the second dielectric layer and the second portion of the dielectric dummy fin layer; depositing a third dielectric layer over the helmet layer; and removing the third dielectric layer, the helmet layer, the dielectric dummy fin layer, and the first dielectric layer over the top surfaces of the first fin and the second fin.

An embodiment of the present disclosure is the method further including depositing the helmet layer over the recessed second portion of the second dielectric layer and the second portion of the dielectric dummy fin layer is performed such that the helmet layer defines a recess over the recessed second portion of the second dielectric layer, and a bottom of the recess is lower than the top surfaces of the first fin and the second fin.

An embodiment of the present disclosure is the method further including etching the first dielectric layer, the first fin and the second fin to expose end surfaces of the first fin and the second fin prior to depositing the dielectric dummy fin layer.

An embodiment of the present disclosure is the method further including depositing the dielectric dummy fin layer is performed such that the dielectric dummy fin layer is in contact with the end surfaces of the first fin and the second fin. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first fin;
a second fin;
an isolation structure between the first fin and the second fin;
a dielectric stage in the isolation structure; and
a helmet layer over the dielectric stage and having a first portion, a second portion, and a third portion connecting the first and second portions, wherein a top surface of the helmet layer is higher than a top surface of the isolation structure, and each of the first and second portions of the helmet layer is thicker than the third portion of the helmet layer.

2. The semiconductor device of claim 1, wherein a thickness of the second portion of the helmet layer is in a range from about 15 nm to about 80 nm.

3. The semiconductor device of claim 1, wherein a thickness difference between the first portion and the third portion of the helmet layer is in a range from about 3 nm to about 40 nm.

4. The semiconductor device of claim 1, further comprising:
a dielectric dummy fin layer wrapping around the dielectric stage.

5. The semiconductor device of claim 4, wherein a top surface of the dielectric dummy fin layer is substantially coplanar with the top surface of the helmet layer.

6. The semiconductor device of claim 4, wherein a top surface of the dielectric dummy fin layer is substantially coplanar with a top surface of the first fin.

7. The semiconductor device of claim 4, further comprising:
a gate structure over the first fin, the helmet layer, and the dielectric dummy fin layer.

8. The semiconductor device of claim 7, wherein a width of the dielectric dummy fin layer along a longitudinal direction of the gate structure is greater than about 60 nm.

9. The semiconductor device of claim 4, further comprising:
a first epitaxy structure adjoining the first fin and in contact with the dielectric dummy fin layer.

10. The semiconductor device of claim 9, further comprising:
a second epitaxy structure adjoining the second fin and in contact with the dielectric dummy fin layer.

11. The semiconductor device of claim 1, further comprising:
a gate structure over the first fin and the helmet layer; and
a gate isolation structure in the gate structure and landing on the helmet layer.

12. A semiconductor device, comprising:
a first fin;
a second fin;
a dielectric stage between an end surface of the first fin and an end surface of the second fin;
a dielectric dummy fin layer wrapping around the dielectric stage and in contact with the end surface of the first fin; and
a helmet layer over the dielectric stage.

13. The semiconductor device of claim 12, wherein a top surface of the dielectric dummy fin layer is substantially coplanar with a top surface of the first fin.

14. The semiconductor device of claim 12, wherein the dielectric dummy fin layer is in contact with the end surface of the second fin.

15. A semiconductor device, comprising:
a substrate;
a first semiconductor fin extending upward from the substrate;
a second semiconductor fin extending upward from the substrate;
a gate structure across the first and second semiconductor fins;
a first dielectric layer interposed between the first and second semiconductor fins and has a U-shape when viewed in a cross section taken along a lengthwise direction of the gate structure;
a second dielectric layer capped by the first dielectric layer; and
an etch stop layer extending above the first semiconductor fin and along a top surface of the first dielectric layer and a top surface of second dielectric layer, wherein a first portion of the etch stop layer in contact with the first dielectric layer is higher than a second portion of the etch stop layer in contact with the second dielectric layer.

16. The semiconductor device of claim 15, wherein the second dielectric layer has end portions in contact with the first dielectric layer and a middle portion between the end portions, and a thickness of the middle portion is thinner than thicknesses of the end portions.

17. The semiconductor device of claim 15, wherein a top surface of the second dielectric layer is lower than a top surface of the first semiconductor fin.

18. The semiconductor device of claim 15, further comprising a spacer layer extending between the substrate and the first dielectric layer and extending upward from the substrate, wherein a topmost surface of the spacer layer is lower than a topmost surface of the first dielectric layer.

19. The semiconductor device of claim 1, wherein the dielectric stage is spaced apart from the first fin and the second fin.

20. The semiconductor device of claim 12, wherein the second fin is aligned with the first fin along a longest dimension of the first fin.

* * * * *